United States Patent
Ootsuka

(10) Patent No.: US 11,482,557 B2
(45) Date of Patent: Oct. 25, 2022

(54) SOLID-STATE IMAGE-CAPTURING DEVICE, SEMICONDUCTOR APPARATUS, ELECTRONIC APPARATUS, AND MANUFACTURING METHOD

(71) Applicant: SONY SEMICONDUCTOR SOLUTIONS CORPORATION, Kanagawa (JP)

(72) Inventor: Yoichi Ootsuka, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/966,311

(22) PCT Filed: Mar. 8, 2019

(86) PCT No.: PCT/JP2019/009389
§ 371 (c)(1),
(2) Date: Jul. 30, 2020

(87) PCT Pub. No.: WO2019/172431
PCT Pub. Date: Sep. 12, 2019

(65) Prior Publication Data
US 2020/0395400 A1    Dec. 17, 2020

(30) Foreign Application Priority Data

Mar. 9, 2018    (JP) .............................. JP2018-042607

(51) Int. Cl.
*H01L 27/146*    (2006.01)
*H01L 21/768*    (2006.01)
*H01L 23/00*    (2006.01)

(52) U.S. Cl.
CPC .. *H01L 27/14636* (2013.01); *H01L 21/76898* (2013.01); *H01L 24/05* (2013.01);
(Continued)

(58) Field of Classification Search
CPC ......... H01L 27/14636; H01L 27/14634; H01L 27/1469; H01L 21/76898; H01L 24/05;
(Continued)

(56) References Cited

U.S. PATENT DOCUMENTS 8,598,720 B2 * 12/2013 Tomita .................. H01L 23/481
257/786
9,230,927 B2 * 1/2016 Shiu ........................ H01L 24/05
(Continued)

FOREIGN PATENT DOCUMENTS

EP    2980841 A1    2/2016
EP    3297025 A1    3/2018
(Continued)

OTHER PUBLICATIONS

International Search Report and Written Opinion of PCT Application No. PCT/JP2019/009389, dated Jun. 4, 2019, 10 pages of ISRWO.

*Primary Examiner* — Dao H Nguyen
(74) *Attorney, Agent, or Firm* — Chip Law Group

(57) ABSTRACT

Provided are a solid-state image-capturing device, a semiconductor apparatus, an electronic apparatus, and a manufacturing method that enable improvement in reliability of through electrodes and increase in density of through electrodes. A common opening portion is formed including a through electrode formation region that is a region in which the plurality of through electrodes electrically connected respectively to a plurality of electrode pads provided on a joint surface side from a device formation surface of a semiconductor substrate is formed. A plurality of through portions is formed so as to penetrate to the plurality of respective electrode pads in the common opening portion, and wiring is formed along the common opening portion and the through portions from the electrode pads to the device formation surface corresponding to the respective through
(Continued)

electrodes. The present technology can be applied to a layer-type solid-state image-capturing device, for example.

19 Claims, 27 Drawing Sheets

(52) U.S. Cl.
CPC ........ *H01L 24/13* (2013.01); *H01L 27/14634* (2013.01); *H01L 2224/02313* (2013.01); *H01L 2224/02372* (2013.01); *H01L 2224/05026* (2013.01); *H01L 2224/05546* (2013.01); *H01L 2224/05548* (2013.01); *H01L 2224/05572* (2013.01); *H01L 2224/13024* (2013.01)

(58) Field of Classification Search
CPC ............... H01L 24/13; H01L 24/02; H01L 2224/02313; H01L 2224/02372; H01L 2224/05026; H01L 2224/05546; H01L 2224/05548; H01L 2224/05572; H01L 2224/13024

USPC ........................................................ 257/459
See application file for complete search history.

(56) References Cited

U.S. PATENT DOCUMENTS

| | | | |
|---|---|---|---|
| 2008/0283951 | A1* | 11/2008 | Nabe ..................... H01L 23/481 257/433 |
| 2016/0035672 | A1 | 2/2016 | Funaya et al. |
| 2016/0118318 | A1* | 4/2016 | Yang ..................... H01L 23/528 257/401 |
| 2018/0152657 | A1 | 5/2018 | Miyazawa |

FOREIGN PATENT DOCUMENTS

| | | |
|---|---|---|
| JP | 2005-311117 A | 11/2005 |
| JP | 2007-053149 A | 3/2007 |
| JP | 2012-033580 A | 2/2012 |
| JP | 2015-002299 A | 1/2015 |
| WO | 2014/155478 A1 | 10/2014 |
| WO | 2016/185901 A1 | 11/2016 |

* cited by examiner

SOLID-STATE IMAGE-CAPTURING DEVICE, SEMICONDUCTOR APPARATUS, ELECTRONIC APPARATUS, AND MANUFACTURING METHOD

CROSS REFERENCE TO RELATED APPLICATIONS

This application is a U.S. National Phase of International Patent Application No. PCT/JP2019/009389 filed on Mar. 8, 2019, which claims priority benefit of Japanese Patent Application No. JP 2018-042607 filed in the Japan Patent Office on Mar. 9, 2018. Each of the above-referenced applications is hereby incorporated herein by reference in its entirety.

TECHNICAL FIELD

The present disclosure relates to a solid-state image-capturing device, a semiconductor apparatus, an electronic apparatus, and a manufacturing method, and in particular, relates to a solid-state image-capturing device, a semiconductor apparatus, an electronic apparatus, and a manufacturing method that enable improvement in reliability of through electrodes and increase in density of through electrodes.

BACKGROUND ART

Conventionally, a layer-type solid-state image-capturing device configured by layering a plurality of semiconductor substrates has a structure, for example, in which an electrode pad is formed on a surface on a side opposite to a surface on which a semiconductor device, a solder ball, and the like are formed on a semiconductor substrate (hereinafter referred to as a device formation surface). Accordingly, the layer-type solid-state image-capturing device is connected to the electrode pad via a through electrode formed so as to penetrate through the semiconductor substrate. For example, the through electrode is formed by photolithography and dry etching, and the depth of the through electrodes becomes from 5 μm to 300 μm, several times greater than that of a normal semiconductor process, typically.

In addition, as the aspect ratio of the through electrode becomes high, the processing time by dry etching becomes long, and hence it becomes difficult to form the cross sectional shape of the side surface of the through electrode so as to be vertical, often resulting in a generation of a recess on the side surface or in the bottom portion of the through electrode or a formation of an overhang. For this reason, there has been a concern that the yield and quality of the device may deteriorate due to the occurrence of step disconnections in the wiring and the deterioration of the coatability of the solder mask. Then, it has been desired to establish a structure of a through electrode in which the step disconnection of wiring is avoided and the coatability of a solder mask is improved, and to establish a manufacturing method of such a through electrode.

For example, Patent Document 1 discloses a funnel-shaped through electrode in which a second hole having an opening area larger than that of a first hole is formed in a funnel shape corresponding to individual through holes, thereby solving short-circuiting with a silicon substrate and disconnection of the through electrode that are caused by overhang and bird beak of the through hole and the like.

In addition, Patent Document 2 discloses a semiconductor wafer in which a through hole having a mortar-shaped opening portion is formed from the back surface of a semiconductor substrate by isotropic and anisotropic dry etching, whereby the hole is easily filled with resist and an insulation film opening pattern can be easily formed.

CITATION LIST

Patent Document

Patent Document 1: Japanese Patent Application Laid-Open No. 2015-2299
Patent Document 2: Japanese Patent Application Laid-Open No. 2007-53149

SUMMARY OF THE INVENTION

Problems to be Solved by the Invention

The technology disclosed in Patent Document 1 has a configuration in which a pair of funnel-shaped holes are formed for one through electrode, and in the technology disclosed in Patent Document 2, a pair of mortar-shaped holes are formed for one through electrode. Therefore, although the reliability of the through electrode can be improved, it has been difficult to increase the density of the through electrodes.

The present disclosure has been made in view of such a circumstance, and is intended to enable improvement in reliability of through electrodes and increase in density of through electrodes.

Solutions to Problems

A solid-state image-capturing device of one aspect of the present disclosure includes: a plurality of through electrodes electrically connected respectively to a plurality of electrode pads provided on a second main plane side from a first main plane of a semiconductor substrate; a common opening portion formed including a through electrode formation region that is a region in which the plurality of through electrodes is formed; a plurality of through portions formed so as to penetrate to the plurality of respective electrode pads in the common opening portion; and wiring formed from the electrode pads to the first main plane corresponding to the respective through electrodes.

A semiconductor apparatus of one aspect of the present disclosure includes: a plurality of through electrodes electrically connected respectively to a plurality of electrode pads provided on a second main plane side from a first main plane of a semiconductor substrate; a common opening portion formed including a through electrode formation region that is a region in which the plurality of through electrodes is formed; a plurality of through portions formed so as to penetrate to the plurality of respective electrode pads in the common opening portion; and wiring formed from the electrode pads to the first main plane corresponding to the respective through electrodes.

An electronic apparatus of one aspect of the present disclosure includes a solid-state image-capturing device, having: a plurality of through electrodes electrically connected respectively to a plurality of electrode pads provided on a second main plane side from a first main plane of a semiconductor substrate; a common opening portion formed including a through electrode formation region that is a region in which the plurality of through electrodes is formed; a plurality of through portions formed so as to penetrate to the plurality of respective electrode pads in the common opening portion; and wiring formed from the electrode pads to the first main plane corresponding to the respective through electrodes.

A manufacturing method of one aspect of the present disclosure includes: forming a common opening portion including a through electrode formation region that is a region in which a plurality of through electrodes electrically connected respectively to a plurality of electrode pads provided on a second main plane side from a first main plane of a semiconductor substrate is formed; forming a plurality of through portions so as to penetrate to the plurality of respective electrode pads in the common opening portion; and forming wiring from the electrode pads to the first main plane corresponding to the respective through electrodes.

In one aspect of the present disclosure, a common opening portion is formed including a through electrode formation region that is a region in which a plurality of through electrodes electrically connected respectively to a plurality of electrode pads provided on a second main plane side from a first main plane of a semiconductor substrate is formed. Then, a plurality of through portions is formed so as to penetrate to the plurality of respective electrode pads in the common opening portion, and wiring is formed from the electrode pads to the first main plane corresponding to the respective through electrodes.

Effects of the Invention

According to one aspect of the present disclosure, it is possible to improve the reliability of through electrodes and increase the density of through electrodes.

It is to be noted that the effects described herein are not necessarily limited, and may be any of the effects described in the present disclosure.

MODE FOR CARRYING OUT THE INVENTION

Hereinafter, specific embodiments to which the present technology is applied will be described in detail with reference to the drawings.

<First Configuration Example of Solid-State Image-Capturing Device>

Figure 1:
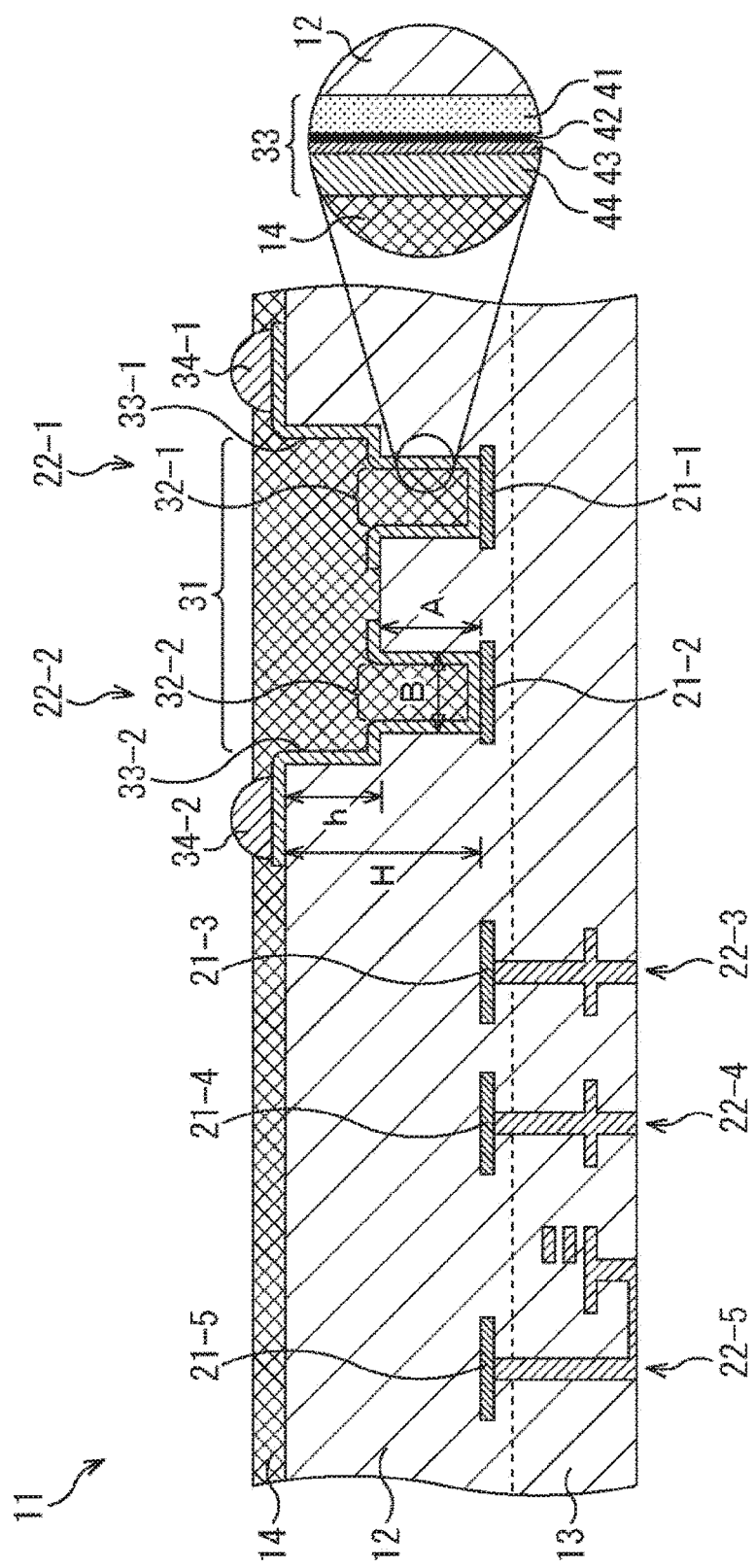
FIG. 1 is a diagram showing a configuration example of a first embodiment of a solid-state image-capturing device.

FIG. 1 is a diagram showing a configuration example of the first embodiment of the solid-state image-capturing device to which the present technology is applied.

As a cross sectional configuration shown in FIG. 1, a solid-state image-capturing device 11 has a two-layer structure in which a circuit board 12 and a sensor board 13 are layered. It is to be noted that the present technology may be applied to, for example, a three-layer structure in which a memory substrate (not shown) is sandwiched and layered between the circuit board 12 and the sensor board 13, and can be applied to a layered structure of three or more layers.

In the circuit board 12, for example, a semiconductor device constituting a logic circuit for performing various types of signal processing to signals output from the sensor board 13 is formed on a device formation surface (surface facing upward in FIG. 1). In addition, the device formation surface of the circuit board 12 is covered with a solder mask 14 including an insulation property for electrical protection.

The sensor board 13 is provided with an image-capturing surface on which a plurality of pixels is formed on a back surface (surface facing downward in FIG. 1) of the semiconductor substrate, for example, and the solid-state image-capturing device 11 is a backside irradiation type image sensor configured so that its image-capturing surface is irradiated with light.

In addition, the solid-state image-capturing device 11 has a layer structure in which the circuit board 12 and the sensor board 13 are electrically and physically joined together on a joint surface indicated by the broken line in FIG. 1. Then, a plurality of electrode pads 21 is formed on the joint surface side of the circuit board 12, and a plurality of through electrodes 22 electrically connected to the electrode pads 21 is formed. In the example shown in FIG. 1, five electrode pads 21-1 to 21-5 are formed on the circuit board 12, and five through electrodes 22-1 to 22-5 are formed so as to be electrically connected to them, respectively.

The electrode pad 21-1 is electrically connected to the device formation surface of the circuit board 12 via the through electrode 22-1 formed so as to penetrate the circuit board 12. Similarly, the electrode pad 21-2 is electrically connected to the device formation surface of the circuit board 12 via the through electrode 22-2 formed so as to penetrate the circuit board 12. In addition, the electrode pads 21-3 to 21-5 are electrically connected to the back surface of the sensor board 13, respectively, by the through electrodes 22-3 to 22-5 formed so as to penetrate the sensor board 13.

Then, the through electrodes 22-1 and 22-2 are configured by forming a through portion 32 so as to penetrate to the electrode pads 21-1 and 21-2, respectively, in a common opening portion 31 formed at a depth h, which is shallower than a depth H to the electrode pad 21 from the device formation surface of the circuit board 12. That is, the solid-state image-capturing device 11 has a structure in which the common opening portion 31 having the depth h that is common to the through electrodes 22 is formed in a through electrode formation region, which is a certain region in which the plurality of through electrodes 22 is formed, and the through portion 32 is formed up to the electrode pad 21 having the depth H. With such a structure, the solid-state image-capturing device 11 is configured such that the aspect ratio (through depth A/through diameter B) of each of the through electrodes 22 in the through portion 32 becomes 1.5 or less.

In addition, the through electrode 22-1 is formed by a through electrode wiring 33-1 formed along the common opening portion 31 and an inner surface (side surface, bottom surface, and the like) of the through portion 32-1 from the electrode pad 21-1 to the device formation surface of the circuit board 12, and a solder ball 34-1 used for connection from the through electrode wiring 33-1 to the outside. Similarly, the through electrode 22-2 is formed by a through electrode wiring 33-2 formed along the common opening portion 31 and an inner surface of the through portion 32-2 from the electrode pad 21-2 to the device formation surface of the circuit board 12, and a solder ball 34-2 used for connection from the through electrode wiring 33-2 to the outside.

Here, as shown in an enlarged manner in FIG. 1, the through electrode wiring 33 has a layer structure in which a barrier metal layer 42, a plating seed layer 43, and a rewiring layer 44 are layered on an insulation film 41 formed on the circuit board 12.

In the solid-state image-capturing device 11 configured in this manner, the common opening portion 31 is formed at the depth h, which is shallower than the depth H to the electrode pads 21 from the device formation surface of the circuit board 12 in the through electrode formation region where the plurality of through electrodes 22 electrically connected from the device formation surface of the circuit board 12 to the plurality of respective electrode pads 21 provided on the joint surface side is formed. Then, the solid-state image-capturing device 11 has a configuration in which a plurality of the through portions 32 is formed so as to penetrate to the plurality of electrode pads 21, respectively, in the common opening portion 31, and the through electrode wiring 33 is formed along the common opening portion 31 and the through portions 32 from the electrode pads 21 to the device formation surface corresponding to the respective through electrodes 22.

At this time, by setting the depth h so that the aspect ratio of the through portion 32 becomes 1.5 or less, the solid-state image-capturing device 11 can be formed so that the processing time by dry etching for forming the through portion 32 can be shortened and the cross sectional shape of the side surface of the through portion 32 becomes vertical. This makes it possible to prevent a recess or an overhang from being formed on the side surface or the bottom surface of the through electrode 22, and to prevent disconnection of the through electrode wiring 33 and deterioration of the coatability of the solder mask 14. Accordingly, it is possible to improve the yield of the solid-state image-capturing device 11, and it is possible to improve the reliability of the through electrode 22. Furthermore, the solid-state image-capturing device 11 can be increased in density by sharing the common opening portion 31 by the plurality of through electrodes 22.

<Manufacturing Method of Solid-State Image-Capturing Device>

A manufacturing process of forming the through electrode 22 on the circuit board 12 in the manufacturing method of manufacturing the solid-state image-capturing device 11 will be described with reference to FIGS. 2 to 4.

Figure 2:
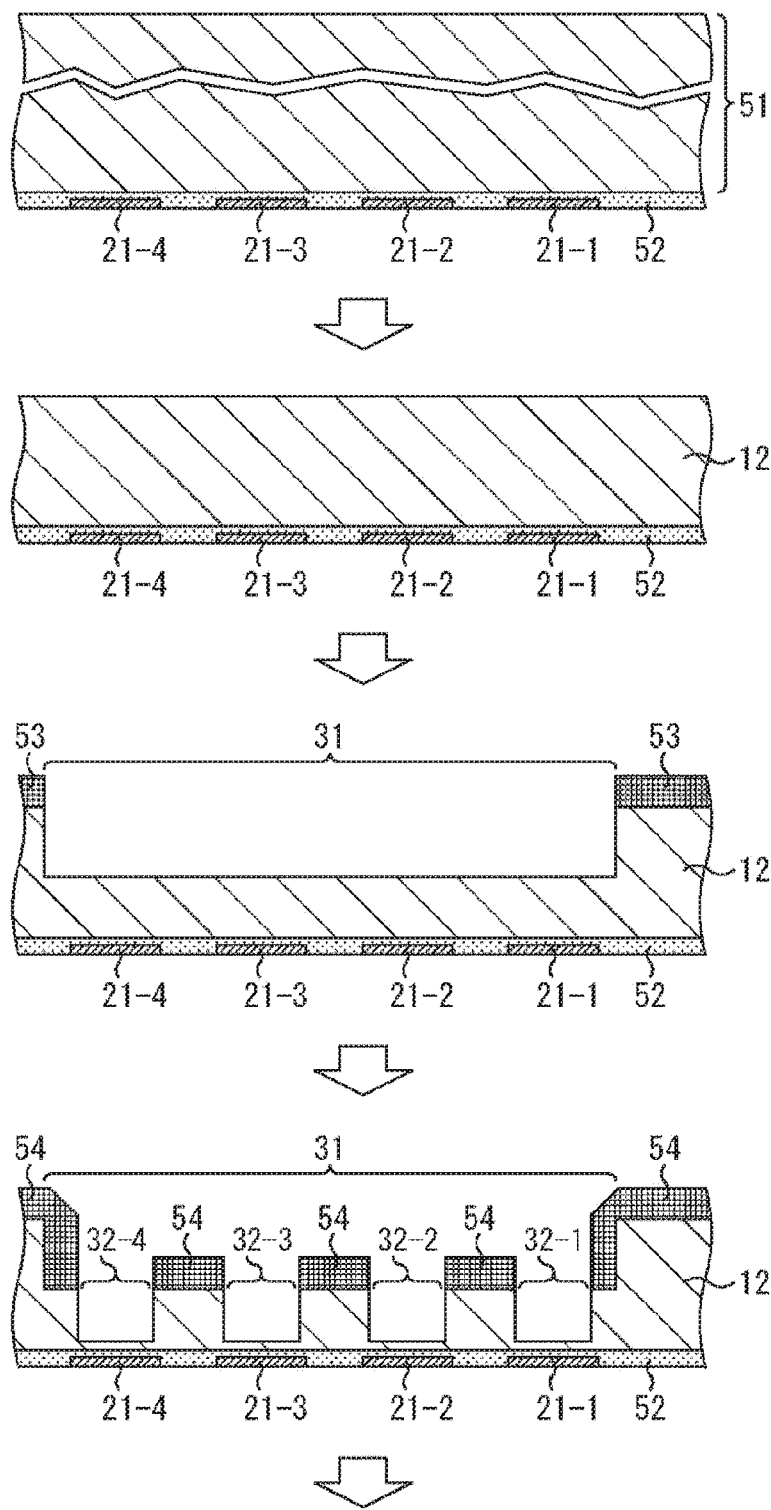
FIG. 2 is an illustration of first to fourth steps of a manufacturing method of the solid-state image-capturing device.

In a first step, as shown in the first stage of FIG. 2, an insulation film 52 is formed on the back surface of a semiconductor substrate 51 having a predetermined thickness, and the electrode pads 21-1 to 21-4 are formed so as to be insulated from each other by the insulation film 52.

In a second step, the surface of the semiconductor substrate 51 is polished using chemical mechanical polishing (CMP) or the like, thereby forming the circuit board 12 having a thickness reduced to a prescribed thickness as shown in the second stage of FIG. 2.

In a third step, a film of a photoresist 53 is formed on the device formation surface of the circuit board 12 except for a region to become the common opening portion 31. Then, using the photoresist 53 as a mask, dry etching is performed up to a predetermined depth (depth h in FIG. 1) from the device formation surface of the circuit board 12, thereby forming the common opening portion 31 as shown in the third stage of FIG. 2.

In a fourth step, after the photoresist 53 is peeled off, a film of a photoresist 54 is formed on the circuit board 12 and the common opening portion 31 except for regions to become through portions 32-1 to 32-4. Then, using the photoresist 54 as a mask, dry etching is performed up to a depth just before penetrating the circuit board 12 from the bottom surface of the common opening portion 31, thereby forming the through portions 32-1 to 32-4 as shown in the fourth stage of FIG. 2.

In a fifth step, after the photoresist 54 is peeled off, a silicon oxide film (SiO2) or a silicon oxynitride film (SiON) is formed by using plasma chemical vapor deposition (CVD) or the like. Due to this, as shown in the first stage of FIG. 3, the insulation film 41 is formed on the device formation surface of the circuit board 12, the inner surfaces of the common opening portion 31 and the through portions 32-1 to 32-4, and the like.

Figure 3:
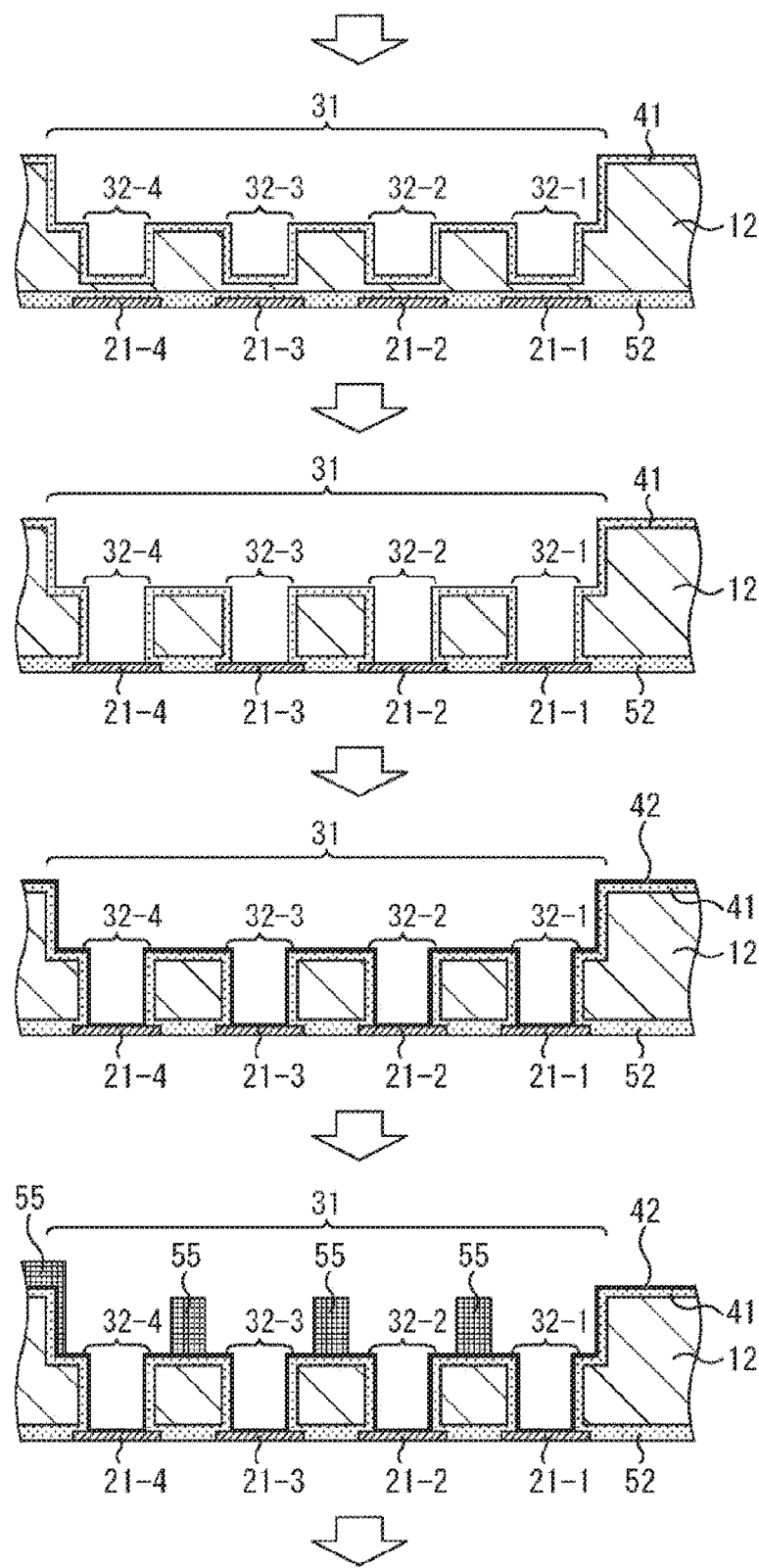
FIG. 3 is an illustration of fifth to eighth steps of the manufacturing method of the solid-state image-capturing device.

In a sixth step, the entire surface of the insulation film 41 is etched back by using dry etching, thereby causing the through portions 32-1 to 32-4 to penetrate up to the electrode pads 21-1 to 21-4 as shown in the second stage of FIG. 3, and exposing the electrode pads 21-1 to 21-4.

In a seventh step, the barrier metal layer 42 is formed by forming a film of titanium or the like by using a sputtering method, as shown in the third stage of FIG. 3. Furthermore, the plating seed layer 43 (not shown) (see FIG. 1) is formed by forming a film of copper or the like.

In an eighth step, a film of a photoresist 55 is formed as shown in the fourth stage of FIG. 3 except for a region where the rewiring layer 44 is formed.

Subsequently, in a ninth step, as shown in the first stage of FIG. 4, a pattern of the rewiring layer 44 is formed by electrolytic plating of copper.

In a tenth step, after the photoresist 55 is peeled off, the exposed plating seed layer 43 (not shown) and the barrier metal layer 42 are removed by using wet etching or the like. Due to this, as shown in the second stage of FIG. 4, the through electrode wirings 33-1 to 33-4 are formed in an independent state for each of the through electrodes 22-1 to 22-4.

In an eleventh step, the photosensitive solder mask 14 is formed. It is to be noted that the solder mask 14 can be formed by applying spin coating if it is liquid, and can be formed by sticking with a vacuum laminate if it is a film. At this time, a developer is removed by a photolithography method in a region where the solder ball 34-1 is formed, thereby forming the solder mask 14 provided with an opening portion 56-1 so that the through electrode wiring 33-1 is exposed in the region. At this time, similarly, opening portions 56-2 to 56-4 (not shown) are provided in the solder mask 14 so that the through electrode wirings 33-2 to 33-4 are exposed corresponding to the regions where the solder balls 34-2 to 34-4 (not shown) are formed.

In a twelfth step, as shown in the fourth stage of FIG. 4, the solder ball 34-1 is formed to the through electrode wiring 33-1 in the opening portion 56-1, thereby forming the through electrode 22-1 having the through electrode wiring 33-1 as described with reference to FIG. 1. At this time, similarly, the solder ball 34 (not shown) is also formed to the through electrode wiring 33-2 to 33-4, respectively, and the through electrodes 22-2 to 22-4 having the through electrode wirings 33-2 to 33-4 are formed.

The above steps can realize the structure described with reference to FIG. 1, and can manufacture the solid-state image-capturing device 11 on which the through electrode 22 with an improved reliability and a higher density is formed on the circuit board 12.

Figure 5:
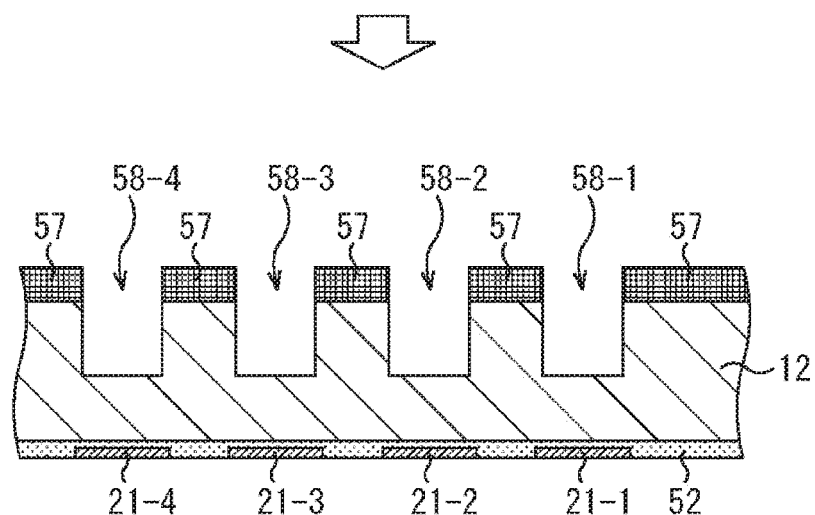
FIG. 5 is an illustration of another example of the manufacturing method of the solid-state image-capturing device.
Figure 5:
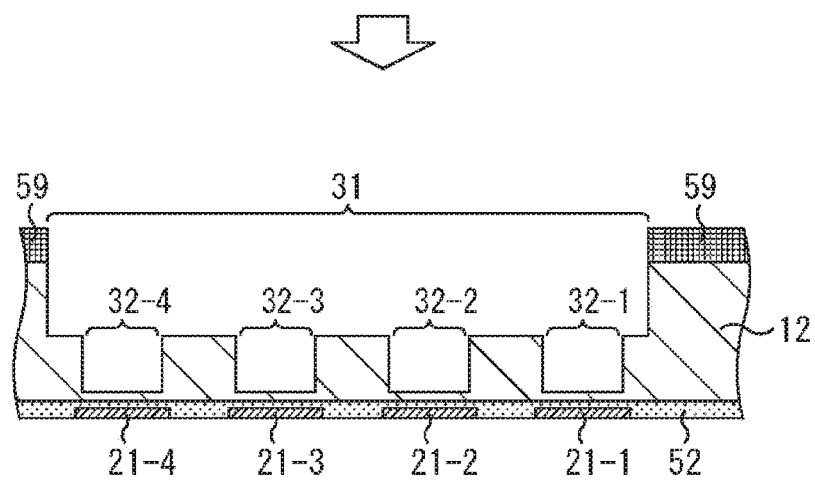

A variation of the manufacturing process of forming the through electrode 22-1 on the circuit board 12 in the manufacturing method of manufacturing the solid-state image-capturing device 11 will be described with reference to FIG. 5. For example, the first and second steps described with reference to FIG. 2 use a similar manufacturing process.

Following the second step, in a twenty-first step, a film of a photoresist 57 is formed on the device formation surface of the circuit board 12 except for regions to become the through portions 32-1 to 32-4. Then, using the photoresist 57 as a mask, dry etching is performed up to a predetermined depth (depth A in FIG. 1) from the device formation surface of the circuit board 12, thereby forming recess portions 58-1 to 58-4 as shown in the first stage of FIG. 5.

In a twenty-second step, a film of a photoresist 59 is formed on the device formation surface of the circuit board 12 except for a region to become the common opening portion 31. Then, using the photoresist 59 as a mask, dry etching is performed up to a predetermined depth (depth h in FIG. 1) from the device formation surface of the circuit board 12. Due to this, as shown in the second stage of FIG. 5, at the same time as the common opening portion 31 is formed, the through portions 32-1 to 32-4 are formed by etching the recess portions 58-1 to 58-4.

Figure 4:
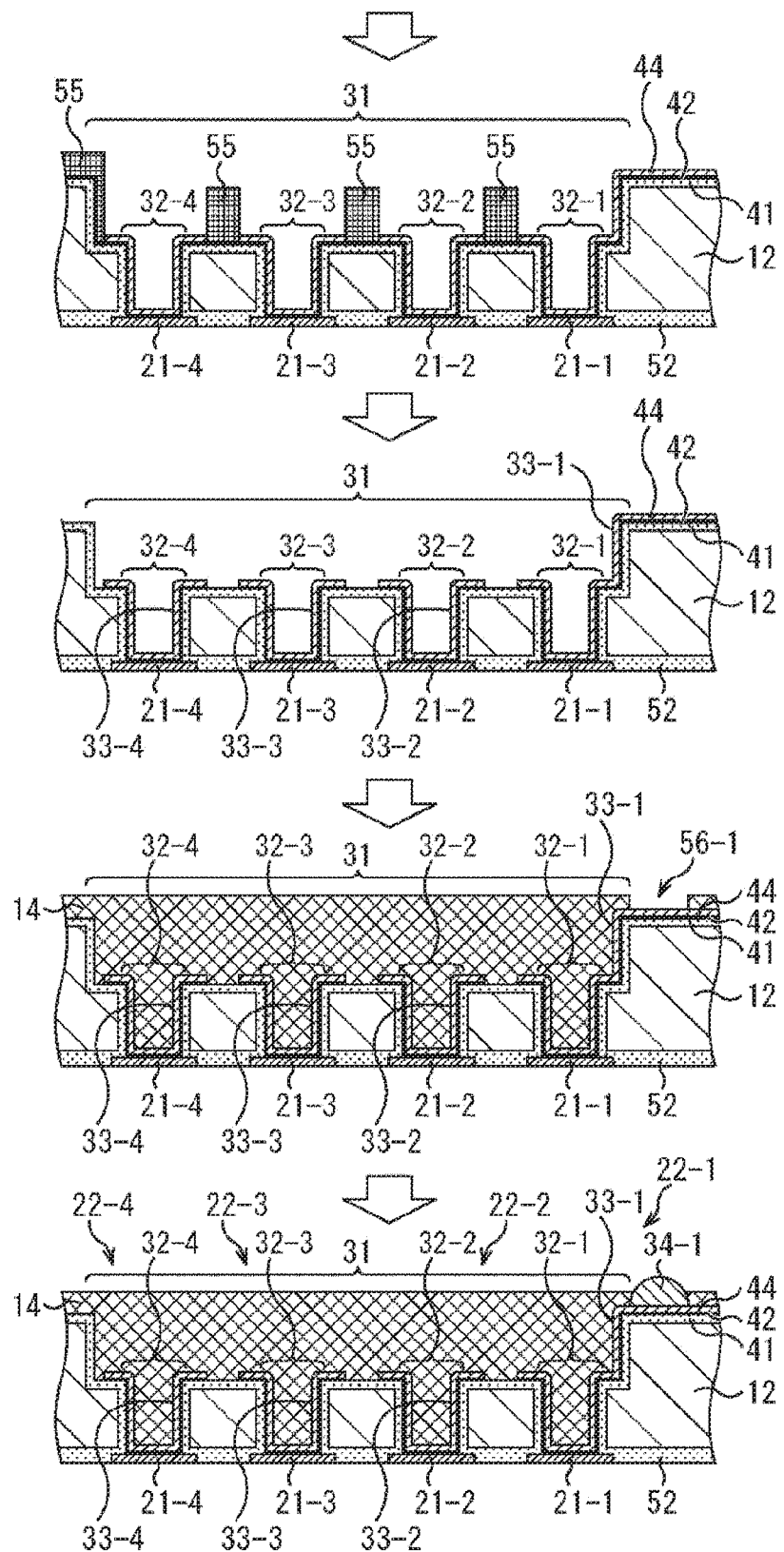
FIG. 4 is an illustration of ninth to twelfth steps of the manufacturing method of the solid-state image-capturing device.

Thereafter, similarly to the description given with reference to FIGS. 3 and 4, the steps from the fifth step to the twelfth step are performed. That is, the manufacturing method of FIG. 5 is a manufacturing process in which the order of the step for forming the common opening portion 31 and the step for forming the through portion 32 is switched with respect to the manufacturing method of FIGS. 2 to 4 described above.

Also, this manufacturing method can realize the structure as described with reference to FIG. 1 similarly to the manufacturing method described with reference to FIGS. 2 to 4. This can manufacture the solid-state image-capturing device 11 on which the through electrode 22 with an improved reliability and a higher density is formed on the circuit board 12.

<Second Configuration Example of Solid-State Image-Capturing Device>

Figure 6:
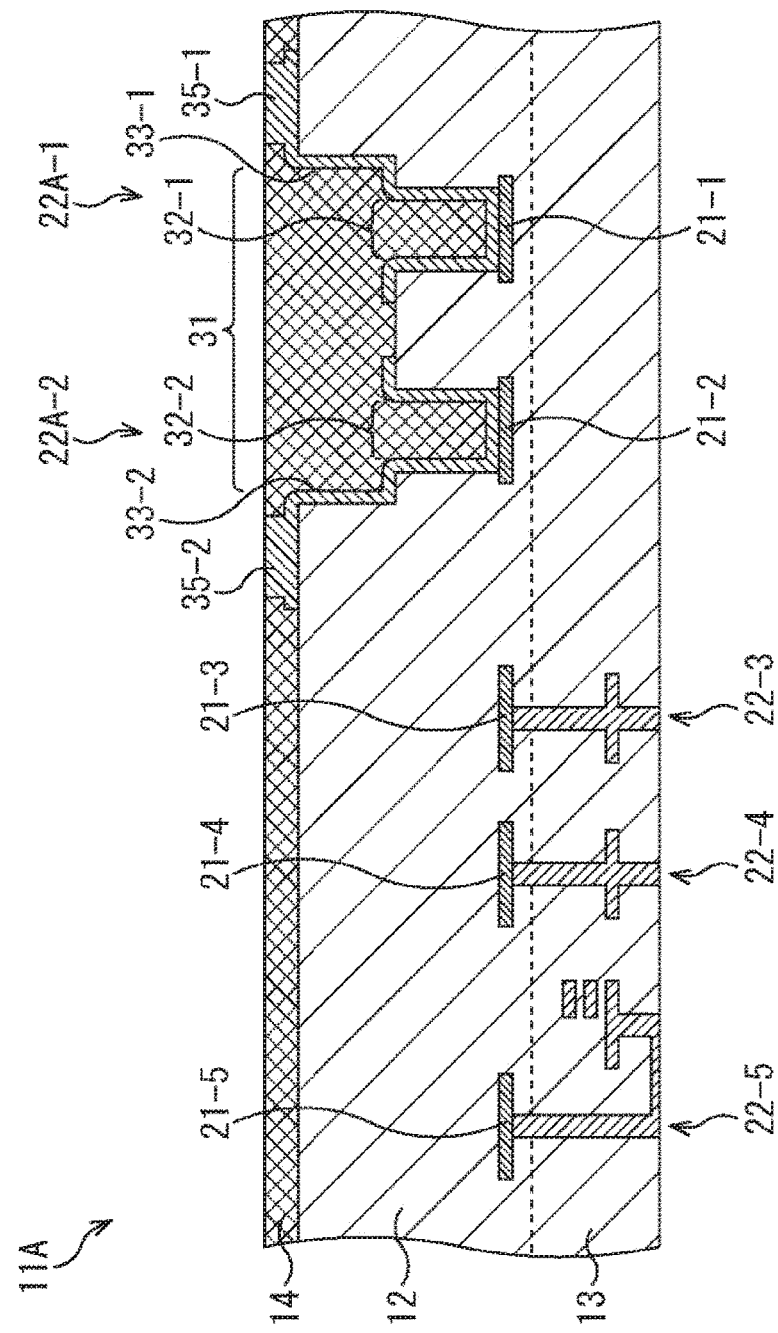
FIG. 6 is a diagram showing a configuration example of a second embodiment of the solid-state image-capturing device.

FIG. 6 is a diagram showing a configuration example of the second embodiment of the solid-state image-capturing device to which the present technology is applied. It is to be noted that in a solid-state image-capturing device 11A shown in FIG. 6, components common to those of the solid-state image-capturing device 11 of FIG. 1 are given the same reference numerals, and detailed description thereof will be omitted.

As shown in FIG. 6, the solid-state image-capturing device 11A has a configuration common to that of the solid-state image-capturing device 11 of FIG. 1 in that the solid-state image-capturing device 11A has, for example a two-layer structure in which the circuit board 12 and the sensor board 13 are layered and the plurality of through portions 32 is formed in the common opening portion 31 to become a through electrode formation region.

Then, the solid-state image-capturing device 11A has a configuration different from that of the solid-state image-capturing device 11 of FIG. 1 in that plane electrode pads 35-1 and 35-2 are used for connection from the through electrode wiring 33-1 and 33-2 to the outside in through electrodes 22A-1 and 22A-2. That is, the solid-state image-capturing device 11 of FIG. 1 is a ball grid array (BGA) in which a plurality of the solder balls 34 is arranged, whereas the solid-state image-capturing device 11A is a land grid array (LGA) in which the plurality of plane electrode pads 35 is arranged. Thus, the present technology can be applied to both BGA and LGA.

The manufacturing process of forming the through electrode 22A on the circuit board 12 in the manufacturing method of manufacturing the solid-state image-capturing device 11A will be described with reference to FIG. 7. For example, from the first step to the tenth step described with reference to FIGS. 2 to 4, a manufacturing process with similar steps is used.

Following the tenth step, a film of a photoresist 61 is formed in a thirty-first step. At this time, a developer is removed by a photolithography method in a region where the plane electrode pad 35-1 is formed, thereby forming an opening portion 62-1 in the photoresist 61 as shown in the first stage of FIG. 7. At this time, similarly, opening portions 62-2 to 62-4 (not shown) are formed in the photoresist 61 corresponding to regions where the plane electrode pads 35-2 to 35-4 (not shown) are formed.

Figure 7:
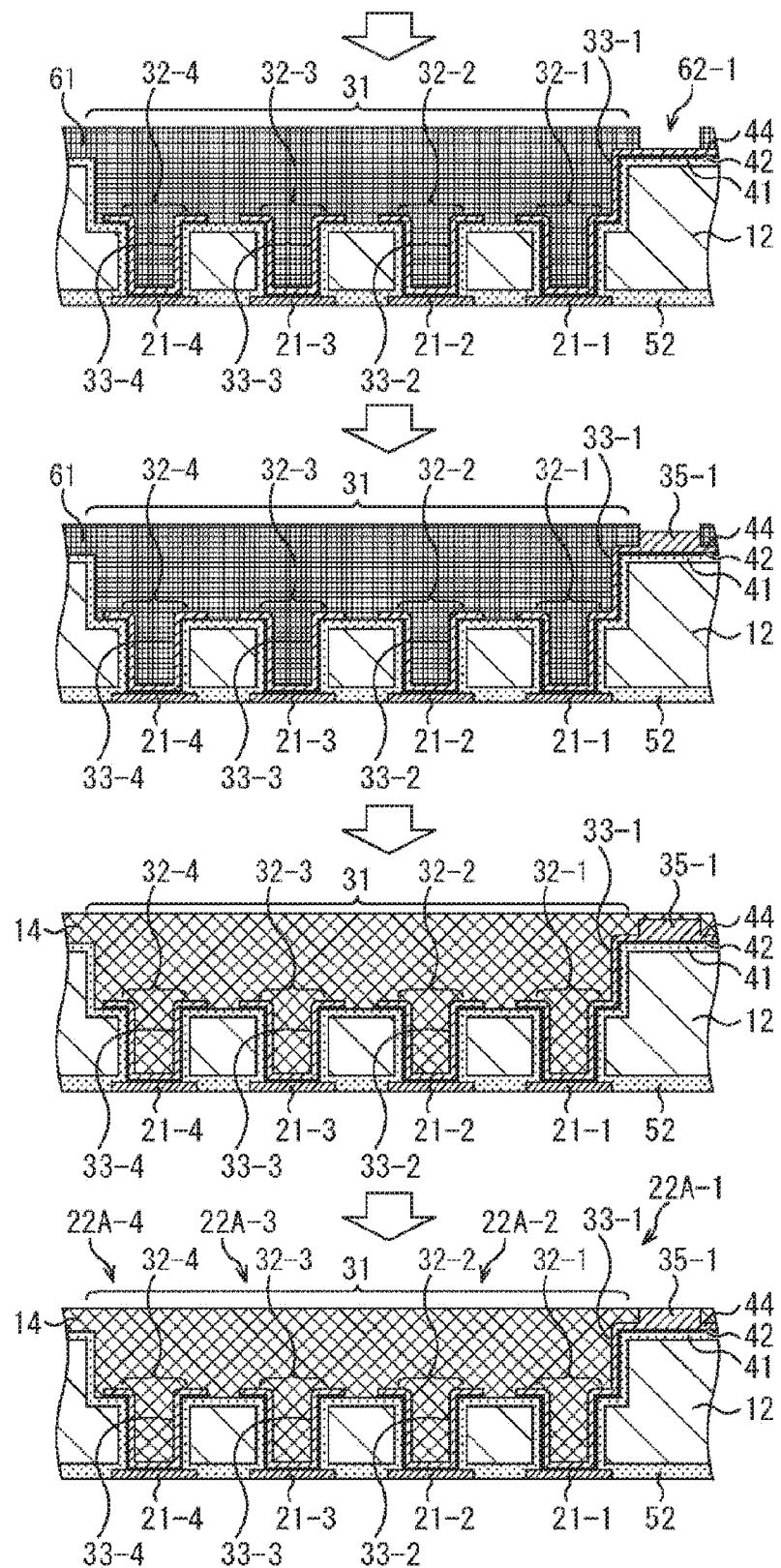
FIG. 7 is an illustration of the manufacturing method of the solid-state image-capturing device of FIG. 6.

In the thirty-second step, electrolytic plating of copper is performed to form the plane electrode pad 35-1 as shown in the second stage of FIG. 7. At this time, similarly, the plane electrode pads 35-2 to 35-4 (not shown) are formed.

In a thirty-third step, the solder mask 14 is formed. It is to be noted that the solder mask 14 formed in this step may be either photosensitive or non-photosensitive, and can be formed by applying spin coating if it is liquid, and can be formed by sticking with a vacuum laminate if it is a film. At this time, as shown in the third stage of FIG. 7, the solder mask 14 is formed so as to coat the entire surface including the plane electrode pad 35-1.

In a thirty-fourth step, by performing CMP or dry etching for the solder mask 14, the surface of the plane electrode pad 35-1 is exposed as shown in the fourth stage of FIG. 7.

The above steps can realize the structure described with reference to FIG. 6, and can manufacture the solid-state image-capturing device 11A on which the through electrode 22A with an improved reliability and a higher density is formed on the circuit board 12.

<Third Configuration Example of Solid-State Image-Capturing Device>

Figure 8:
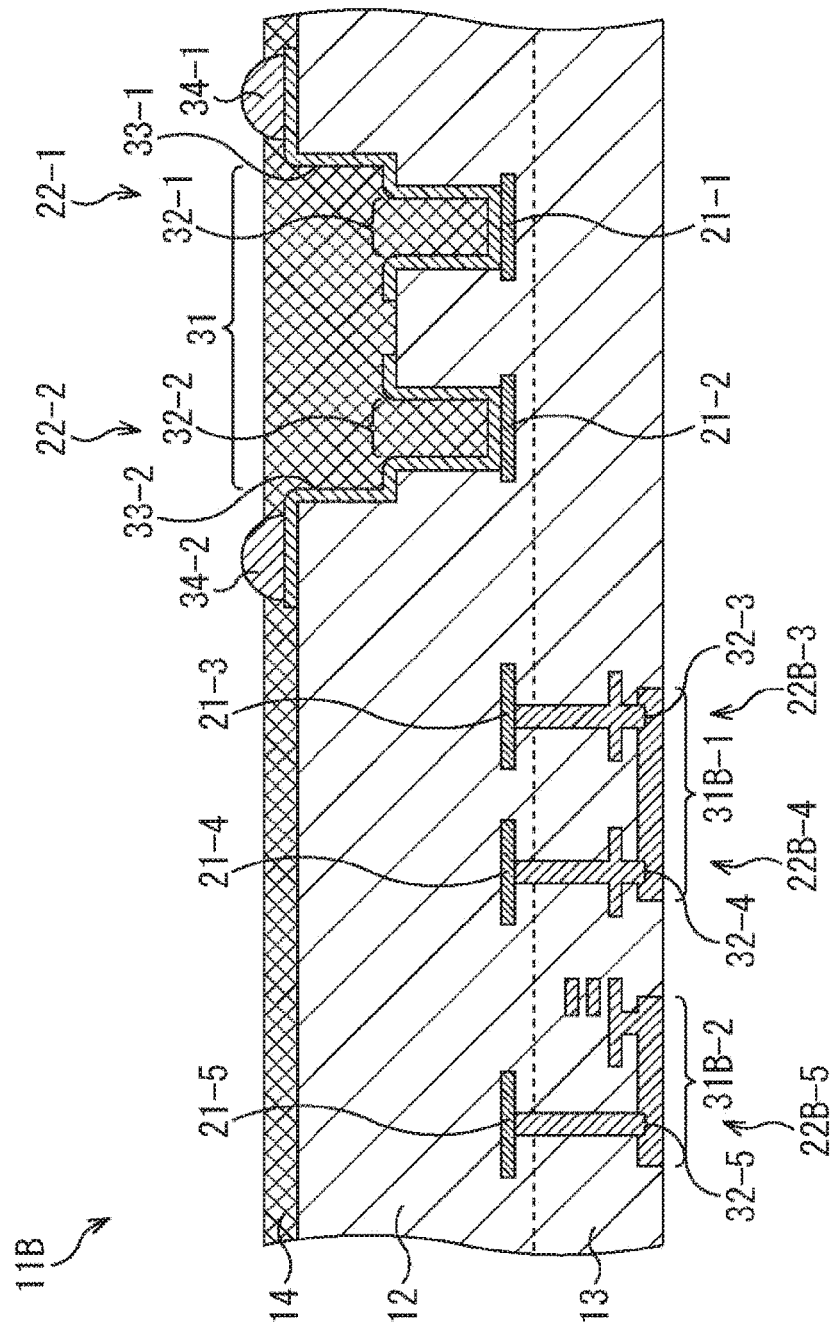
FIG. 8 is a diagram showing a configuration example of a third embodiment of the solid-state image-capturing device.

FIG. 8 is a diagram showing a configuration example of the third embodiment of the solid-state image-capturing device to which the present technology is applied. It is to be noted that in a solid-state image-capturing device 11B shown in FIG. 8, components common to those of the solid-state image-capturing device 11 of FIG. 1 are given the same reference numerals, and detailed description thereof will be omitted.

As shown in FIG. 8, the solid-state image-capturing device 11B has a configuration common to that of the solid-state image-capturing device 11 of FIG. 1 in that the solid-state image-capturing device 11B has, for example a two-layer structure in which the circuit board 12 and the sensor board 13 are layered and the through electrodes 22-1 and 22-2 that perform connection to the device formation surface of the circuit board 12 are formed.

Then, the solid-state image-capturing device 11B has a configuration different from that of the solid-state image-capturing device 11 of FIG. 1 in through electrodes 22B-3 to 22B-5 that perform connection to the back surface side of the sensor board 13. For example, the solid-state image-capturing device 11B has a configuration in which the through electrodes 22B-3 and 22B-4 are formed with the through portions 32-3 and 32-4 in a common opening portion 31B.

That is, the configuration in which the common opening portion 31 is shared by the plurality of through electrodes 22 can be applied to the connection to the back surface of the sensor board 13, similarly to the connection to the device formation surface of the circuit board 12.

Due to this, the solid-state image-capturing device 11B can improve the reliability and increase the density also in the through electrode 22B that performs connection to the back surface of the sensor board 13.

<Variations in Cross Sectional Shape of Through Electrode>

Variations in the cross sectional shape of the through electrode 22 will be described with reference to FIGS. 9 to 13.

For example, the cross sectional shapes of the side surfaces of the common opening portion 31 and the through portion 32 that constitute the through electrode 22 can be formed into a tapered shape (forward tapered shape that widens upward) by performing isotropic dry etching, or formed into a vertical shape by performing anisotropic dry etching. For example, in the solid-state image-capturing device 11 of FIG. 1, the side surfaces of the common opening portion 31 and the through portion 32 are formed in a vertical shape. Furthermore, by performing isotropic dry etching at an initial stage and then switching to anisotropic dry etching, it is possible to form the cross sectional shapes of the side surfaces of the common opening portion 31 and the through portion 32 such that the upper portion has a tapered shape.

Figure 9:
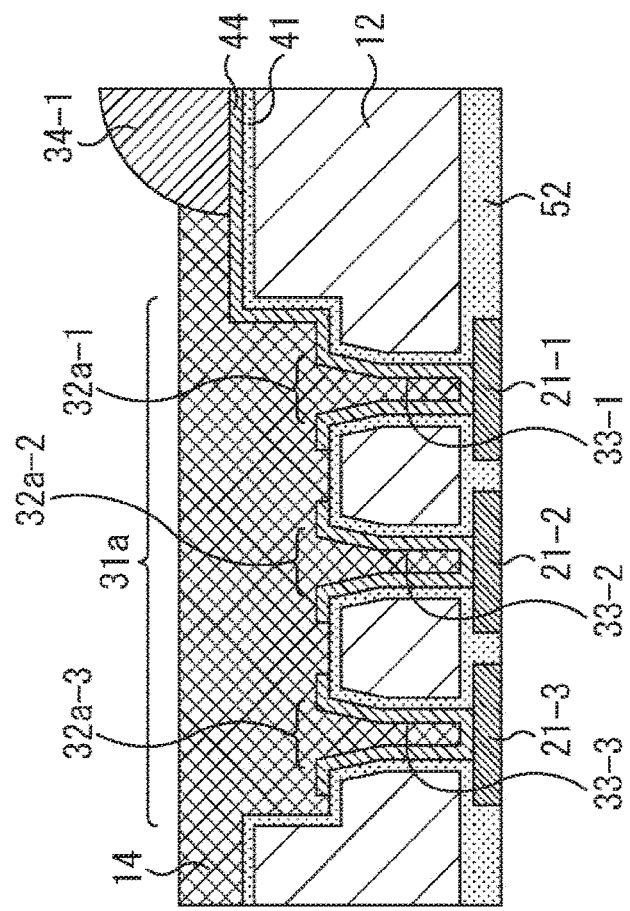
FIG. 9 is a diagram showing a first shape example of a cross sectional shape of a through electrode.

A first variation shown in FIG. 9 has a cross sectional shape in which the side surface of a common opening portion 31a is formed in a vertical shape, and the side surfaces of through portions 32a-1 to 32a-3 are formed in a tapered shape in the upper portions of the side surfaces and in a vertical shape in the lower portions of the side surfaces.

Figure 10:
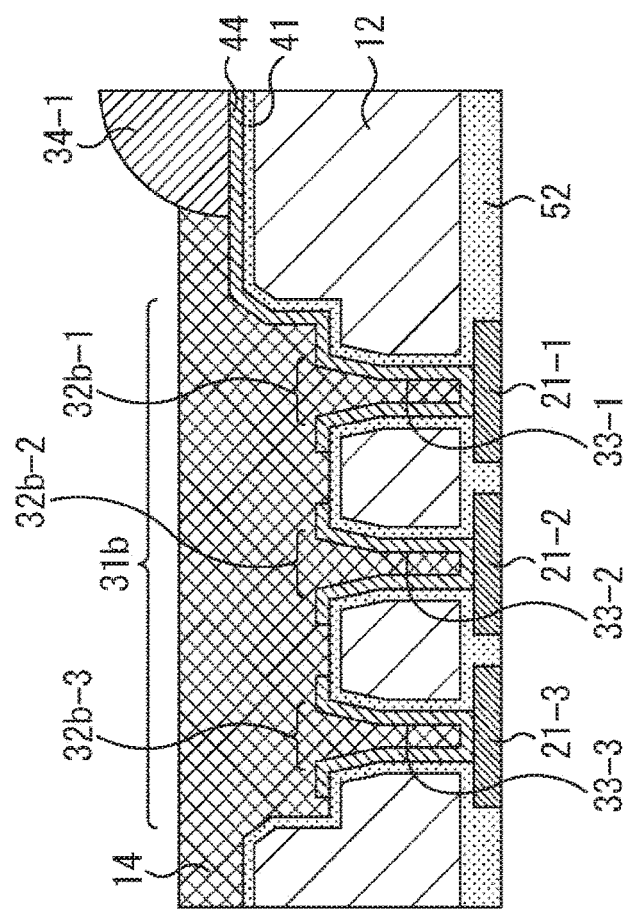
FIG. 10 is a diagram showing a second shape example of the cross sectional shape of the through electrode.

A second variation shown in FIG. 10 has a cross sectional shape in which the side surfaces of both a common opening portion 31b and through portions 32b-1 to 32b-3 are formed in a tapered shape in the upper portions of the side surfaces and in a vertical shape in the lower portions of the side surfaces.

Figure 11:
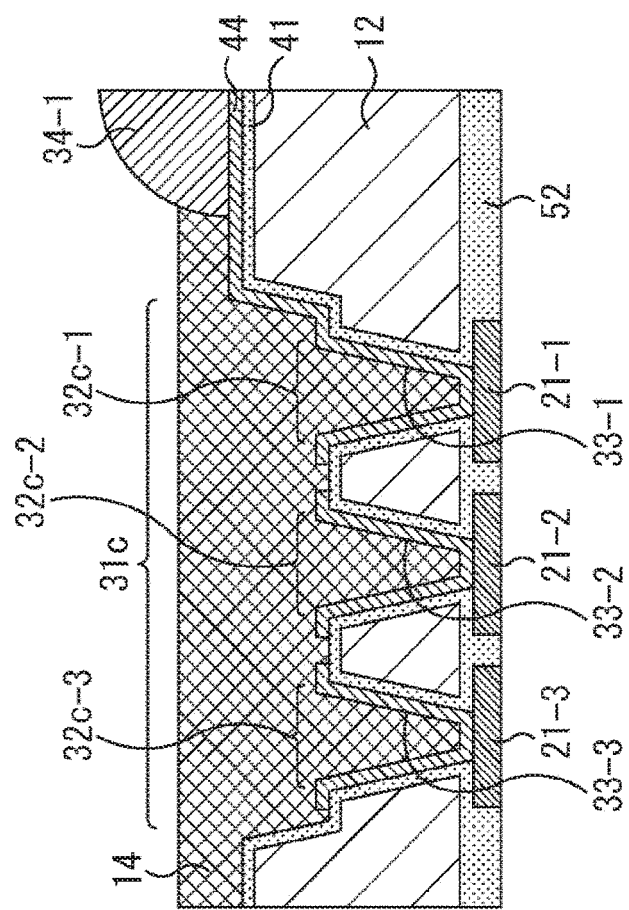
FIG. 11 is a diagram showing a third shape example of the cross sectional shape of the through electrode.

A third variation shown in FIG. 11 has a cross sectional shape in which the entire side surfaces of both a common opening portion 31c and through portions 32c-1 to 32c-3 are formed in a tapered shape.

Figure 12:
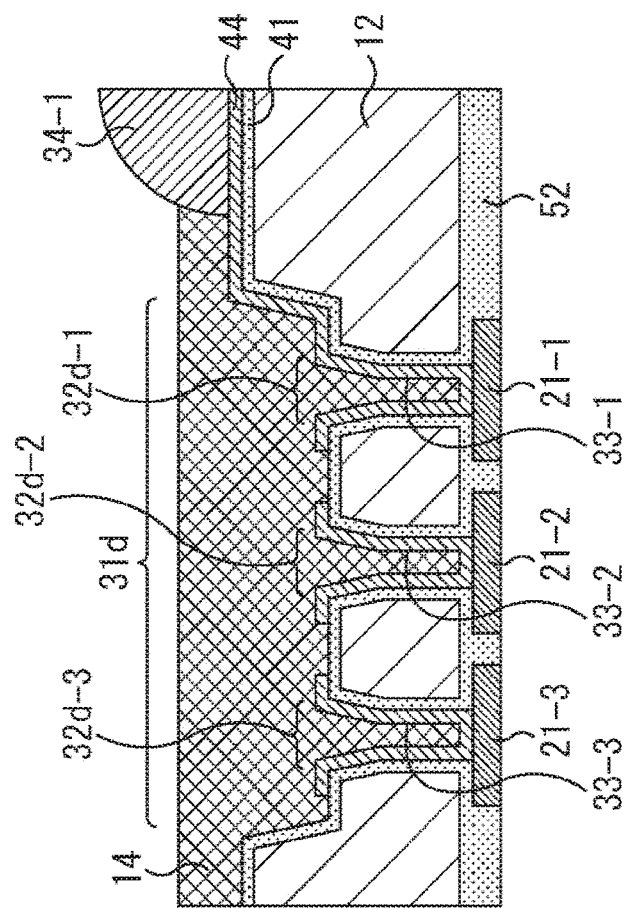
FIG. 12 is a diagram showing a fourth shape example of the cross sectional shape of the through electrode.

A fourth variation shown in FIG. 12 has a cross sectional shape in which the entire side surface of a common opening portion 31d is formed in a tapered shape, and the side surfaces of through portions 32d-1 to 32d-3 are formed in a tapered shape in the upper portions of the side surfaces and in a vertical shape in the lower portions of the side surfaces.

Figure 13:
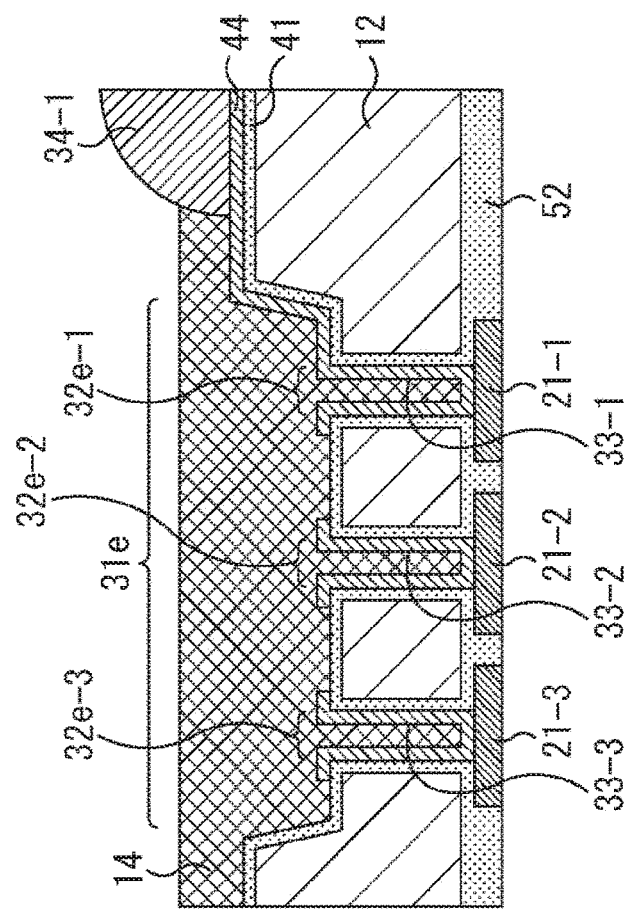
FIG. 13 is a diagram showing a fifth shape example of the cross sectional shape of the through electrode.

A fifth variation shown in FIG. 13 has a cross sectional shape in which the entire side surface of a common opening portion 31e is formed in a tapered shape, and the side surfaces of through portions 32e-1 to 32e-3 are formed in a vertical shape.

In this manner, a tapered shape and a vertical shape can be used in combination as the cross sectional shape of the through electrode 22. Of course, anything other than the combinations shown in FIGS. 9 to 13 may be adopted as the cross sectional shape of the through electrode 22.

Here, with reference to a schematic cross sectional view shown in FIGS. 14A and 14B, the definition of the vertical shape and the tapered shape in the cross sectional shape of the through electrode 22 described above will be described.

Figure 14A:
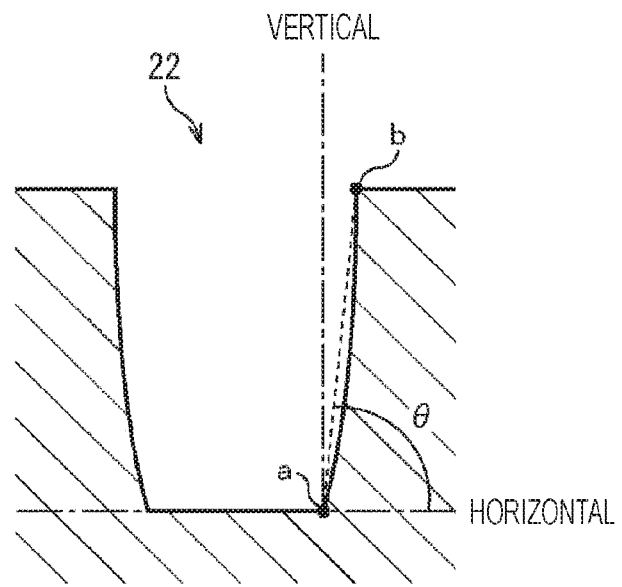
FIGS. 14A and 14B are illustrations of a definition of a vertical surface and a tapered surface of the through electrode.

For example, as shown in FIG. 14A, in the cross sectional shape of the through electrode 22, the vertical surface is defined as that an angle θ of a straight line connecting a point a that is a boundary between the bottom surface and the side surface and a point b that is a boundary between the surface and the side surface with respect to the horizon is within a range of ±5° with respect to 90°.

Figure 14B:
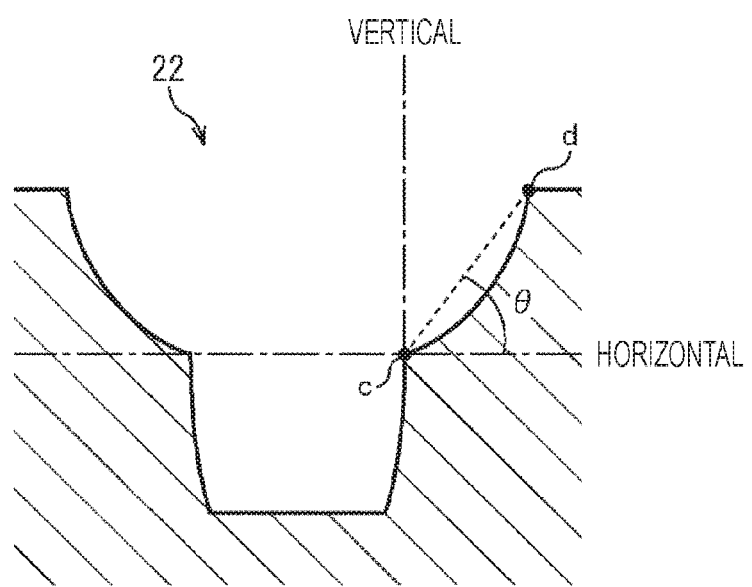

In addition, as shown in FIG. 14B, in the cross sectional shape of the through electrode 22, the tapered surface is defined as that an angle θ of a straight line connecting a point c that is a boundary between the vertical side surface of the lower portion and the tapered side surface of the upper portion and a point d that is a boundary between the surface and the side surface with respect to the horizon is less than 85°.

<Layout of through electrode formation region>

A planar layout of the through electrode formation region in which the plurality of through electrodes 22 is formed will be described with reference to FIGS. 15A, 15B, 16A, 16B, 16C and 16D.

Figure 15A:
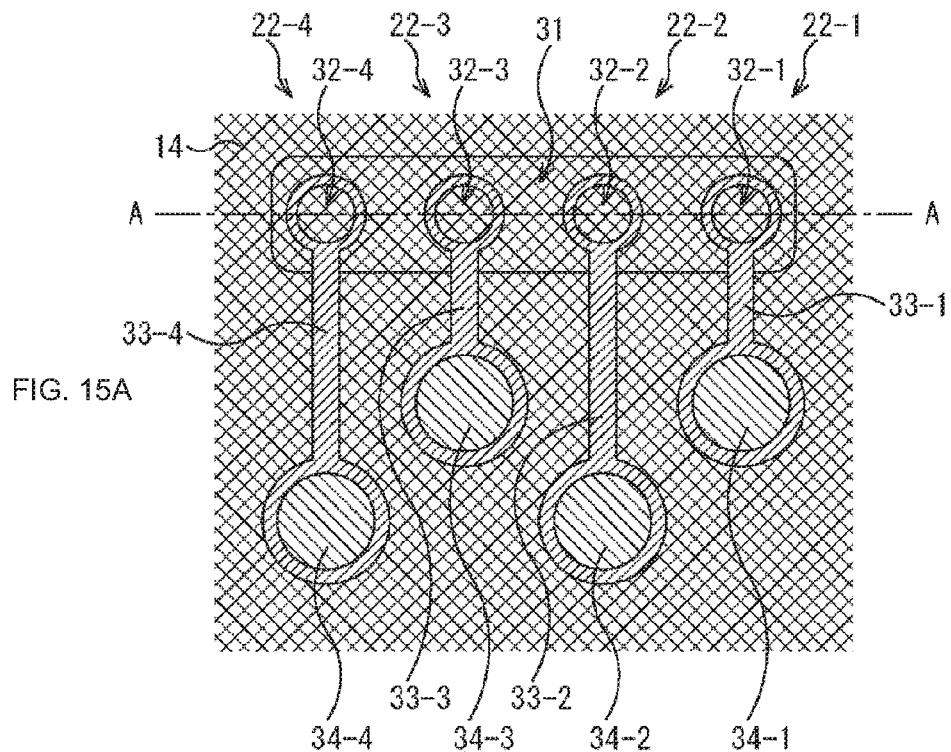
FIGS. 15A and 15B are diagrams showing a planar layout of a through electrode formation region.
Figure 15B:
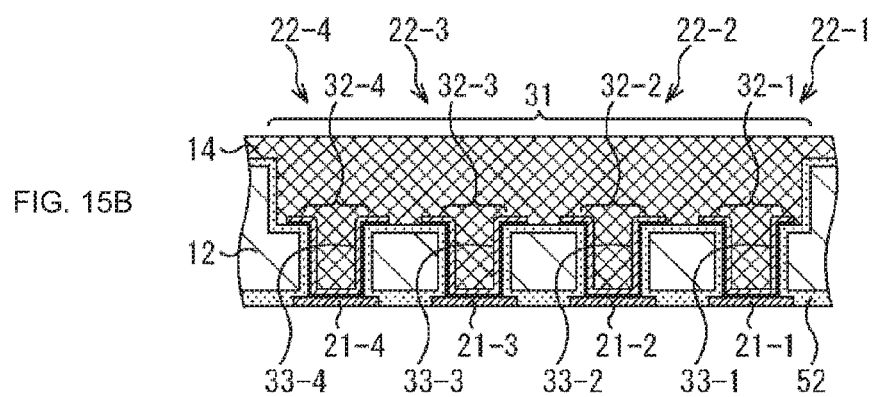

FIG. 15A shows a planar layout of the through electrode formation region in which the plurality of through electrodes 22 is formed, and FIG. 15B shows a cross sectional configuration example in a cross section A-A shown in FIG. 15A.

As shown in FIGS. 15A and 15B, for example, the four through electrodes 22-1 to 22-4 are arranged in a row, and the common opening portion 31 is commonly used by the through electrodes 22-1 to 22-4.

FIGS. 16A, 16B, 16C, and 16D show a planar variation of the through electrode formation region in which the plurality of through electrodes 22 is formed.

Figure 16A:
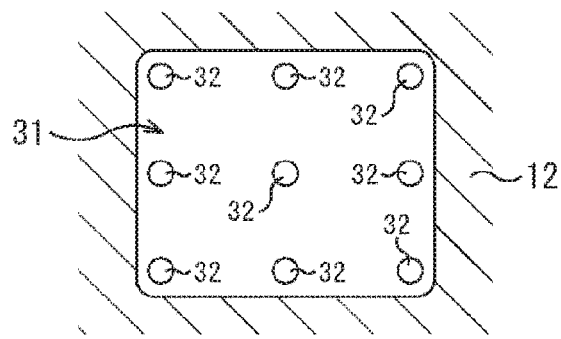
FIGS. 16A, 16B, 16C, and 16D are illustrations of a planar variation of the through electrode formation region.
Figure 16B:
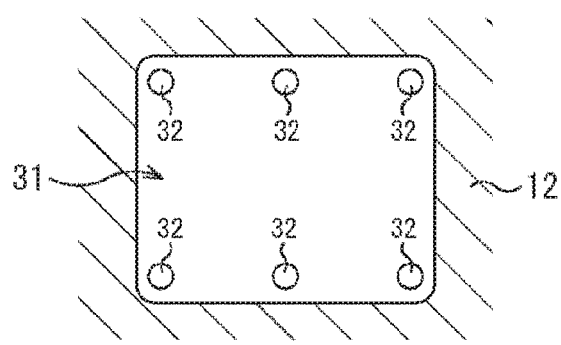

For example, FIG. 16A shows the through electrode formation region in which one common opening portion 31 is provided corresponding to all the through portions 32 of the nine through electrodes 22 in which three through electrodes 22 per row are arranged in three rows in the column direction. Similarly, FIG. 16B shows the through electrode formation region in which one common opening portion 31 is provided corresponding to all the through portions 32 of the six through electrodes 22 in which three through electrodes 22 per row are arranged in two rows in the column direction.

Figure 16C:
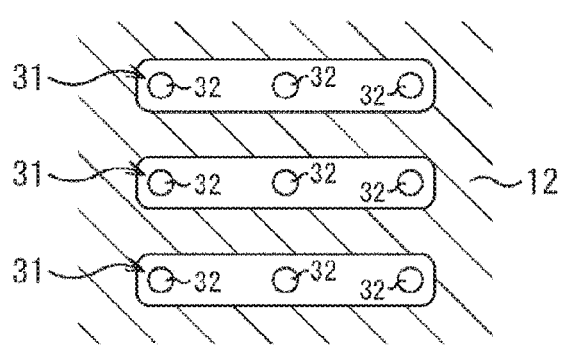
Figure 16D:
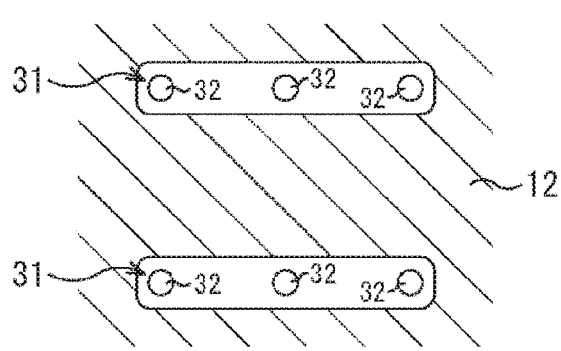

In addition, FIG. 16C shows the through electrode formation region in which three common opening portions 31 are provided in the through portions 32 of each row, corresponding to the nine through electrodes 22 in which three through electrodes 22 are arranged in three rows in the column direction. Similarly, FIG. 16D shows the through electrode formation region in which two common opening portions 31 are provided in the through portions 32 of each row, corresponding to the six through electrodes 22 in which three through electrodes 22 are arranged in two rows in the column direction.

Thus, the solid-state image-capturing device 11 can be configured such that one common opening portion 31 is provided and shared by all of a plurality of through electrodes 22, or a plurality of common opening portions 31 is provided and shared by a predetermined number of through electrodes 22.

It is to be noted that the through electrode 22 of the present embodiment can be applied to various semiconductor apparatuses such as a logic chip and a memory chip in addition to the solid-state image-capturing device 11.

<Fourth Configuration Example of Solid-State Image-Capturing Device>

Figure 17:
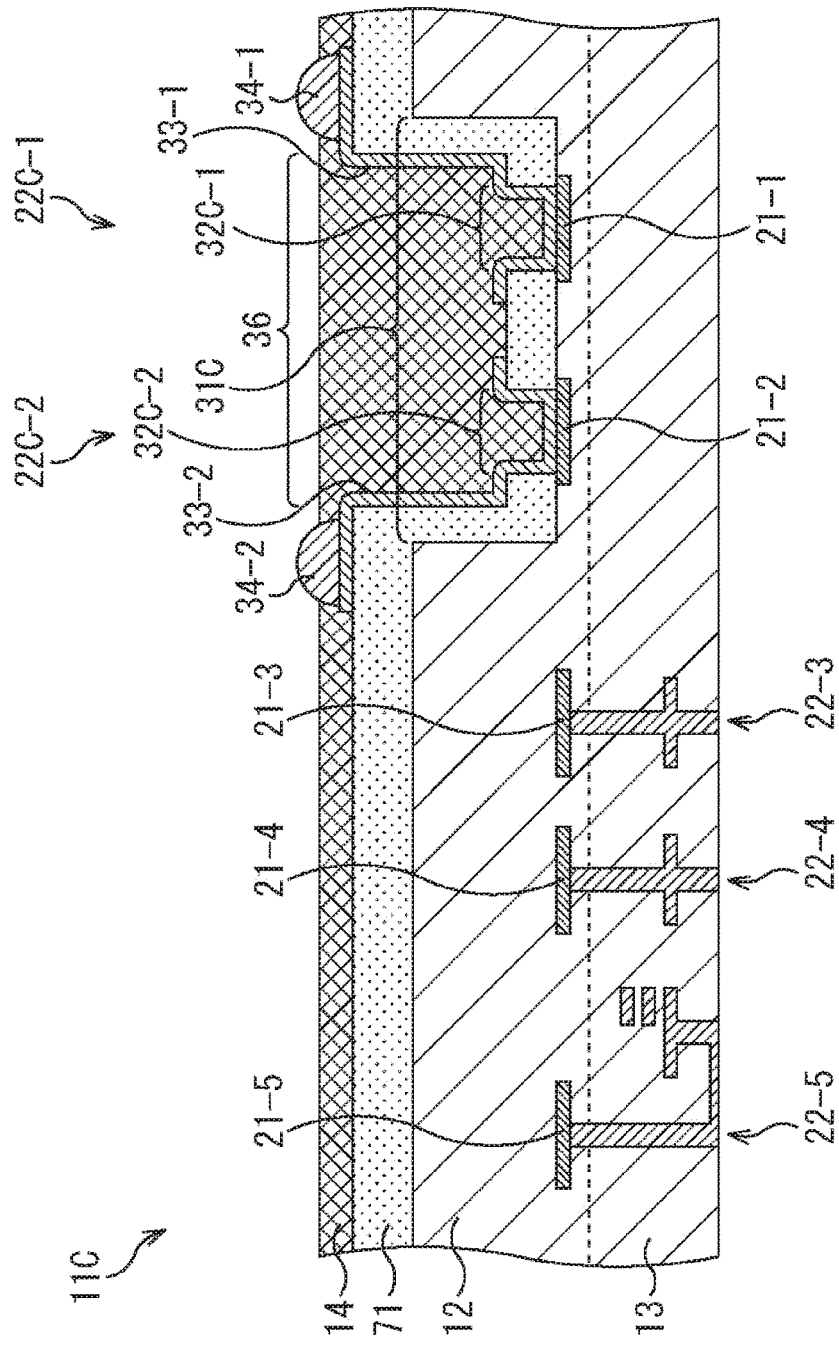
FIG. 17 is a block diagram showing a configuration example of an image-capturing apparatus.

FIG. 17 is a diagram showing a configuration example of the fourth embodiment of the solid-state image-capturing device to which the present technology is applied. It is to be noted that in a solid-state image-capturing device 11C shown in FIG. 17, components common to those of the solid-state image-capturing device 11 of FIG. 1 are given the same reference numerals, and detailed description thereof will be omitted.

As shown in FIG. 17, the solid-state image-capturing device 11C has a two-layer structure in which the circuit board 12 and the sensor board 13 are layered, similarly to the solid-state image-capturing device 11 of FIG. 1.

Then, in the solid-state image-capturing device 11C, a common opening portion 31C is formed up to a depth at which the electrode pads 21-1 and 21-2 are exposed from the device formation surface of the circuit board 12 so as to include the through electrode formation region in which through electrodes 22C-1 and 22C-2 are formed. In addition, an insulation film 71 including an inorganic film or an organic film is layered on the device formation surface of the circuit board 12, and the insulation film 71 is embedded inside the common opening portion 31C.

Furthermore, a recess portion 36 is formed on the insulation film 71 inside the common opening portion 31C so as to include the through electrodes 22C-1 and 22C-2 at a depth shallower than a depth to the electrode pad 21 from the device formation surface of the circuit board 12. Then, through portions 32C-1 and 23C-2 are formed so as to penetrate from the bottom surface of the recess portion 36 to the electrode pads 21-1 and 21-2, respectively. Accordingly, the through electrode wiring 33-1 and 33-2 are formed along the through portions 32C-1 and 23C-2 and the recess portion 36 so as to be layered on the insulation film 71.

The solid-state image-capturing device 11C configured in this manner, similarly to the solid-state imaging device 11 of FIG. 1, can improve the reliability of the through electrode 22C and increase the density.

Figure 18:
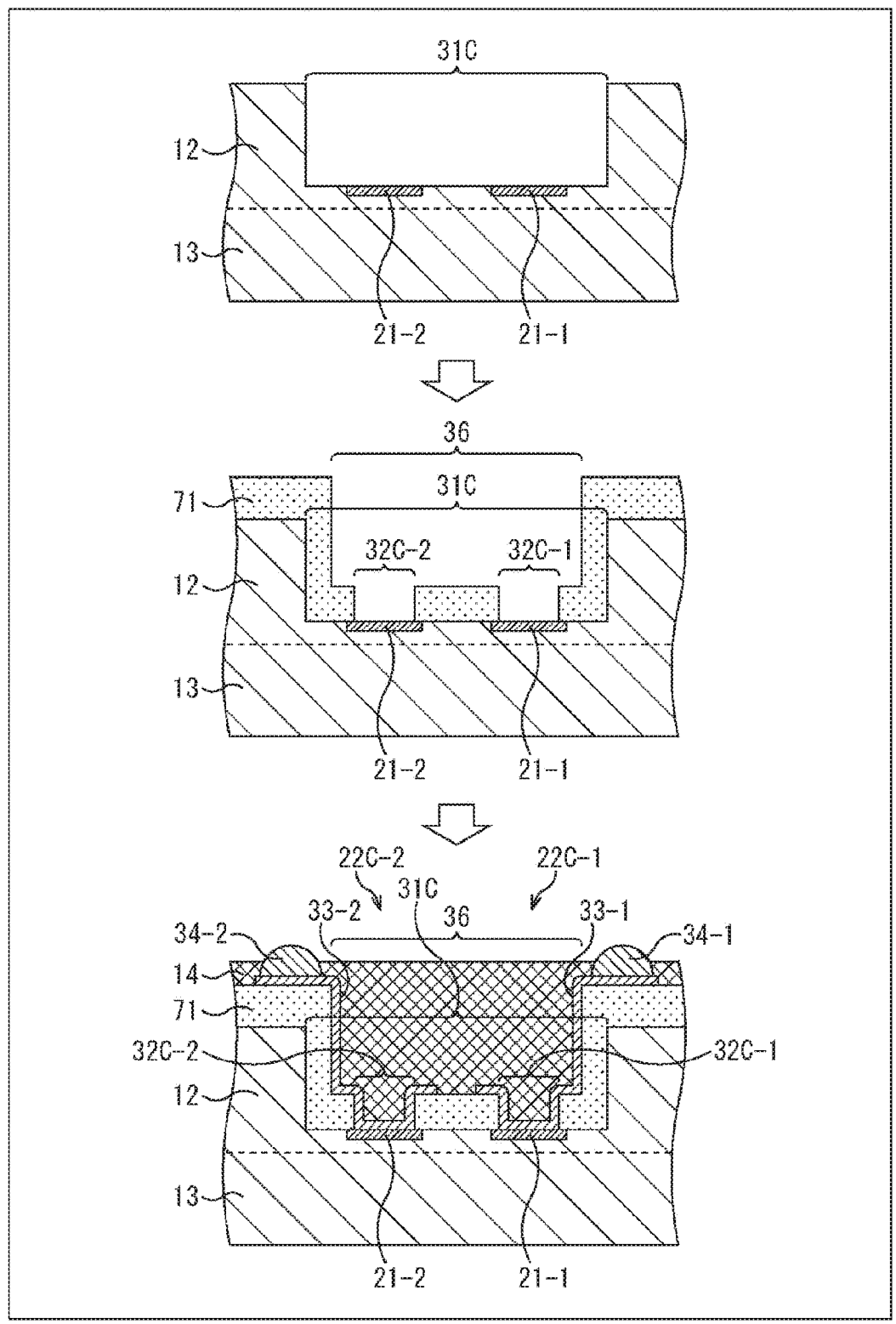
FIG. 18 is a diagram showing a usage example of an image sensor.

The manufacturing process of forming the through electrode 22C on the circuit board 12 in the manufacturing method of manufacturing the solid-state image-capturing device 11C will be described with reference to FIG. 18.

In a forty-first step, a film of a photoresist (not shown) is formed except for a region to become the common opening portion 31C, and dry etching is performed to a depth at which the electrode pads 21-1 and 21-2 are exposed from the device formation surface of the circuit board 12. Thus, as shown in the first stage of FIG. 18, the common opening portion 31C is formed.

In a forty-second step, the insulation film 71 is formed on the entire surface of the device formation surface of the circuit board 12 so as to be embedded inside the common opening portion 31C. Then, the recess portion 36 of a predetermined depth is formed by engraving the insulation film 71 that is inside the common opening portion 31C, and the through portions 32C-1 and 23C-2 are formed by engraving the insulation film 71 of the bottom surface of the recess portion 36. Due to this, as shown in the second stage of FIG. 18, the through portions 32C-1 and 23C-2 are formed so that the electrode pads 21-1 and 21-2 are exposed in the recess portion 36.

In a forty-third step, the through electrode wiring 33-1 and 33-2 are formed along the through portions 32C-1 and 23C-2 and the recess portion 36 from the electrode pads 21-1 and 21-2 to the surface of insulation film 71 (surface of the circuit board 12 on the device formation surface side). Furthermore, as shown in the third stage of FIG. 18, the solder mask 14 is formed, and the solder balls 34-1 and 34-2 are formed.

The above steps can manufacture the solid-state image-capturing device 11C on which the through electrode 22C opening up to the electrode pad 21 in two stages is formed inside the common opening portion 31C by processing the insulation film 71.

<Fifth Configuration Example of Solid-State Image-Capturing Device>

Figure 19:
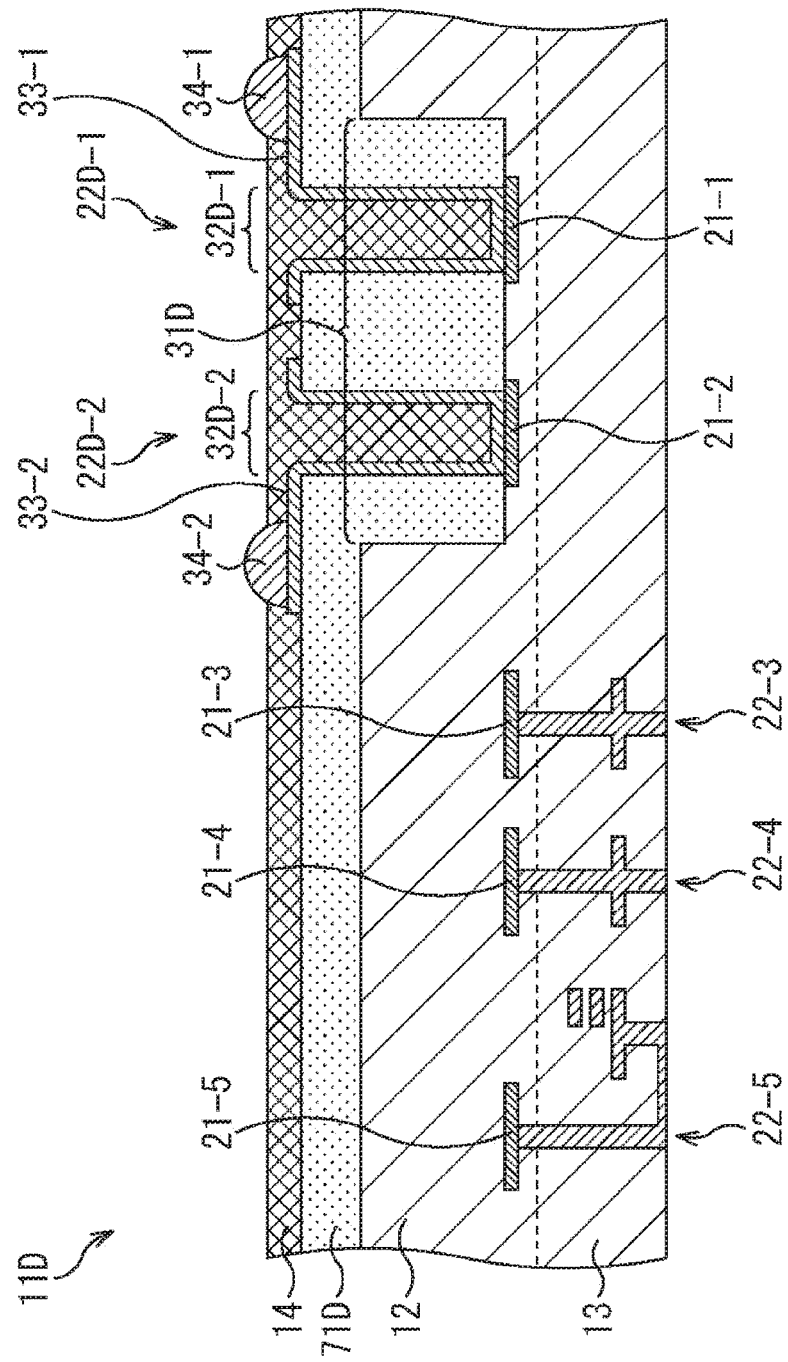
FIG. 19 is a diagram showing a configuration example of a fourth embodiment of the solid-state image-capturing device.

FIG. 19 is a diagram showing a configuration example of the fifth embodiment of the solid-state image-capturing device to which the present technology is applied. It is to be noted that in a solid-state image-capturing device 11D shown in FIG. 19, components common to those of the solid-state image-capturing device 11 of FIG. 1 and the solid-state image-capturing device 11C of FIG. 17 are given the same reference numerals, and detailed description thereof will be omitted.

As shown in FIG. 19, in the solid-state image-capturing device 11D, similarly to the common opening portion 31C of FIG. 17, a common opening portion 31D is formed to a depth at which the electrode pads 21-1 and 21-2 are exposed from the device formation surface of the circuit board 12 so as to include the through electrode formation region in which through electrodes 22D-1 and 22D-2 are formed.

Then, in the solid-state image-capturing device 11D, an insulation film 71D is formed so as to be flat with the device formation surface of the circuit board 12 even in the through electrode formation region in which the through electrodes 22D-1 and 22D-2 are formed.

Furthermore, in the through electrode formation region, through portions 32D-1 and 23D-2 are formed so as to penetrate to the through electrodes 22D-1 and 22D-2 from the surface of the insulation film 71D. In addition, the through electrode wiring 33-1 and 33-2 are formed along the through portions 32D-1 and 23D-2 so as to be layered on the insulation film 71D.

That is, the solid-state image-capturing device 11D is configured by the through electrodes 22D-1 and 22C-2 being formed by the through portions 32D-1 and 23D-2 formed so as to engrave the insulation film 71D inside the common opening portion 31D.

As described above, the solid-state image-capturing devices 11C and 11D employ a configuration in which the insulation film 71 and the insulation film 71D are embedded. This allows the manufacturing cost of the solid-state image-capturing devices 11C and 11D to be reduced.

Figure 20:
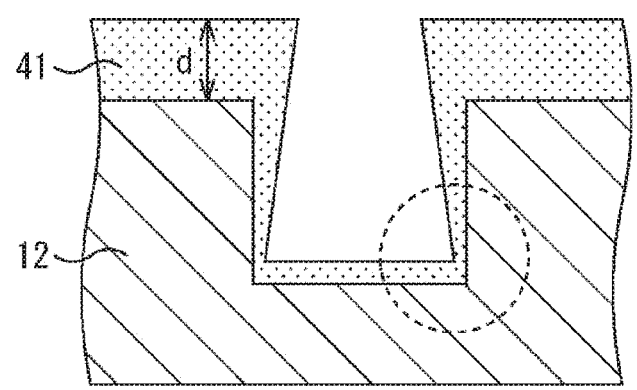
FIG. 20 is an illustration of a manufacturing method of the solid-state image-capturing device of FIG. 19.

For example, in a configuration using the inorganic insulation film 41 as in the solid-state image-capturing device 11 of FIG. 1, in order to ensure the withstand voltage of the through electrode 22, it is necessary to thickly form the insulation film 41 (for example, the film thickness d shown in FIG. 20) due to the coverage characteristic at the time of film formation. In particular, it is necessary to form the insulation film 41 such that the film thickness at the bottom corner portion (for example, a portion surrounded by the broken line in FIG. 20) where the coverage characteristic deteriorates is ensured to be at least equal to or greater than the withstand voltage characteristic.

For example, in a case of the through electrode 22 having the through portion 32 with the diameter of about 40 to 100 µm and the depth of about 60 to 100 µm, the film thickness of the insulation film 41 at the bottom corner portion where the coverage characteristic deteriorates is about 8 to 10 µm. In this case, there is a concern that the manufacturing cost increases as a result of reduction in processing capability of the film forming apparatus forming the insulation film 41 and deterioration of productivity.

On the other hand, in the solid-state image-capturing devices 11C and 11D, it is only required to form a film by coating or laminating, for example, when the insulation film 71 and the insulation film 71D include resin, and the required film thickness can be secured. As a result, the manufacturing costs of the solid-state image-capturing devices 11C and 11D can be reduced.

Since the solid-state image-capturing device 11D has a configuration in which the through electrodes 22D-1 and 22D-2 are formed so as to penetrate to the through electrodes 22D-1 and 22D-2 from the surface of the insulation film 71D, the solid-state image-capturing device 11D has a structure in which the aspect ratio of the through portions 32D-1 and 23D-2 is high. For example, the through electrode 22D having the through portion 32D with the diameter of about 40 to 100 µm and the depth of about 60 to 100 µm is formed.

Figure 21:
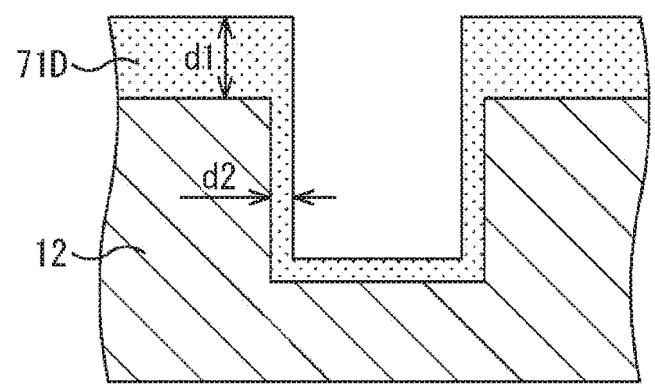
FIG. 21 is a diagram showing a configuration example of a fifth embodiment of the solid-state image-capturing device.

In this case, in the solid-state image-capturing device 11D, by using a photosensitive resin as the insulation film 71D, an i-line stepper or the like can be used for lithography used for processing the insulation film 71D. Thus, the insulation film 71D is only required to be processed so as to ensure a film thickness (for example, film thicknesses d1 and d2 shown in FIG. 21) of at least about 0.5 µm with respect to the opening portion of the circuit board 12, for example. Then, from the processing accuracy when the i-line stepper is used, even if the solid-state image-capturing device 11D has a structure in which the aspect ratio becomes high, the reliability can be improved and the density can be increased as described above.

<Configuration Example of Electronic Apparatus>

The solid-state image-capturing device 11 as described above can be applied to various electronic apparatuses such as an image-capturing system such as a digital still camera and a digital video camera, a mobile phone including an image-capturing function, or other apparatus including an image-capturing function.

Figure 22:
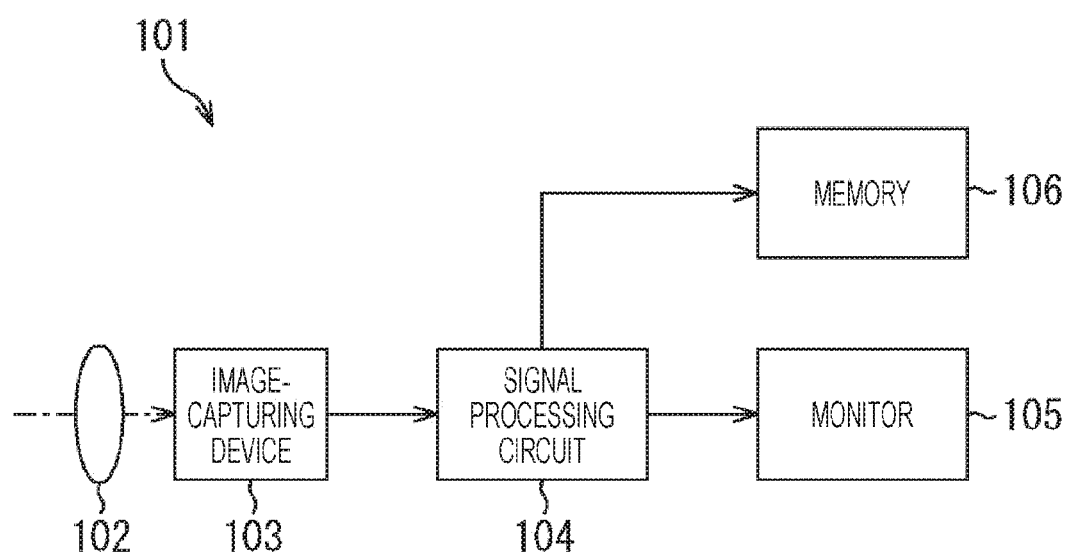
FIG. 22 is an illustration of a film thickness of an insulation film.

FIG. 22 is a block diagram showing a configuration example of an image-capturing apparatus mounted on an electronic apparatus.

As shown in FIG. 22, an image-capturing apparatus 101 includes an optical system 102, an image-capturing device 103, a signal processing circuit 104, a monitor 105, and a memory 106, and is capable of capturing a still image and a moving image.

The optical system 102 is configured to have one or a plurality of lenses, and guides image light (incident light) from a subject to the image-capturing device 103 to form an image on a light-receiving surface (sensor unit) of the image-capturing device 103.

The solid-state image-capturing device 11 described above is applied as the image-capturing device 103. In the image-capturing device 103, electrons are accumulated for a certain period of time in accordance with an image formed on the light-receiving surface via the optical system 102. Then, a signal corresponding to the electrons accumulated in the image-capturing device 103 is supplied to the signal processing circuit 104.

The signal processing circuit 104 performs various types of signal processing on the pixel signals output from the image-capturing device 103. An image (image data) obtained by signal processing performed by the signal processing circuit 104 is supplied to and displayed on the monitor 105 or supplied to and stored (recorded) in the memory 106.

By applying the solid-state image-capturing device 11 described above, the image-capturing apparatus 101 configured in this manner, for example, more reliable image-capturing can be performed.

<Usage Example of Image Sensor>

Figure 23:
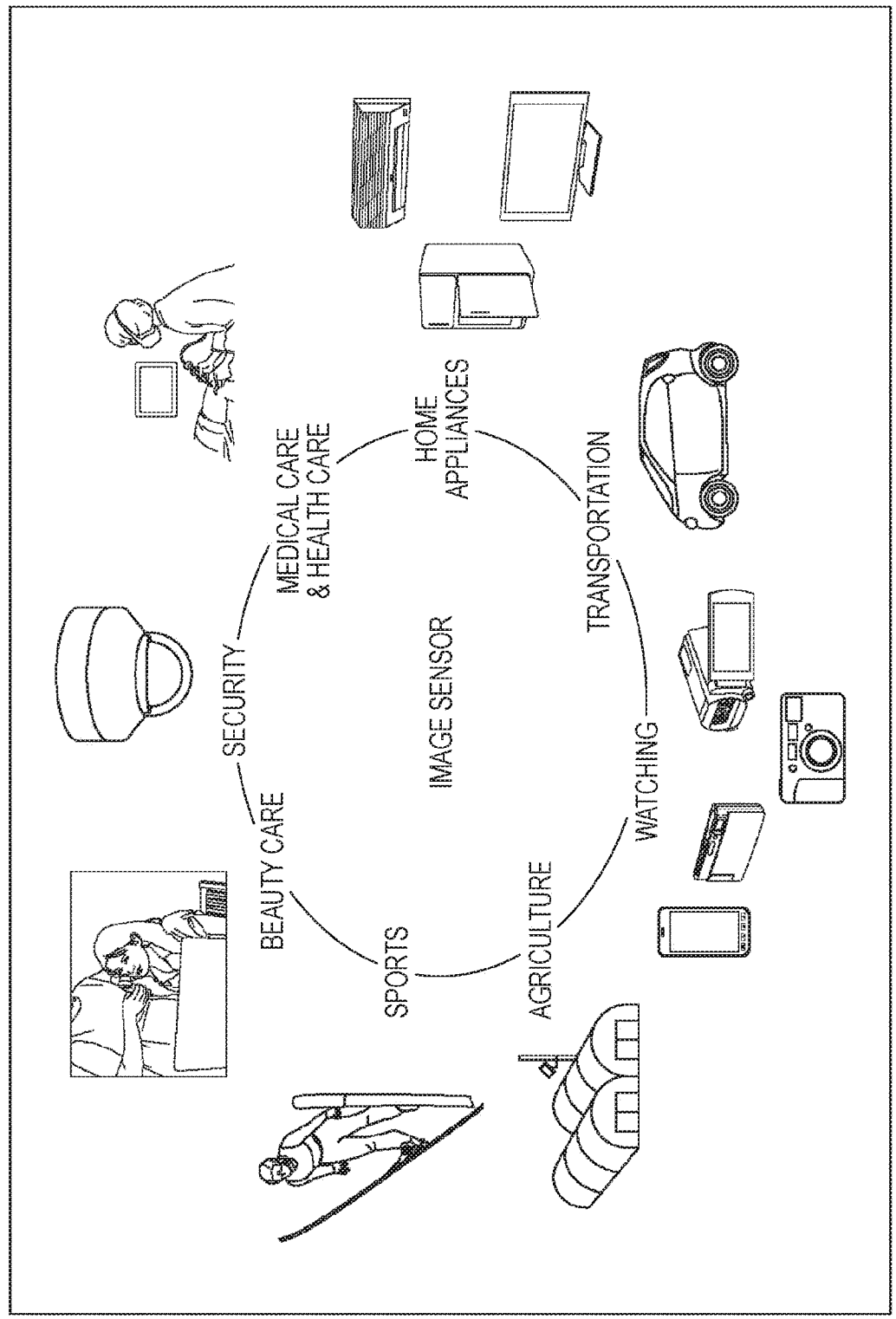
FIG. 23 is an illustration of processing for an insulation film.

FIG. 23 is a diagram showing a usage example in which the image sensor (solid-state image-capturing device) described above is used.

The image sensor described above can be used in various cases of sensing light such as visible light, infrared light, ultraviolet light, and X-ray, for example, as described below.

Apparatuses that capture images to be used for watching such as a digital camera and a mobile apparatus with a camera function Apparatuses used for transportation, such as vehicle-mounted sensors that capture images of front, rear, surroundings, vehicle interior, and the like for the purpose of safe driving such as automatic stop and recognizing the state of the driver, and the like, monitoring cameras that monitor traveling vehicles and roads, distance measuring sensors that measure distances between vehicles, and the like.

Apparatuses used for home appliances such as TVs, refrigerators, and air conditioners, in order to capture an image of a user's gesture and operate the apparatus in response to the gesture Apparatuses used for medical care and health care, such as endoscopes and apparatuses that perform angiography by receiving infrared light Apparatuses used for security, such as surveillance cameras for security purposes and cameras for person authentication purposes Apparatuses used for beauty care such as skin measuring instruments that capture an image of the skin and microscopes that capture the scalp Apparatuses, for example, used for sports, such as action cameras and wearable cameras for sports applications Apparatuses used for agriculture, such as cameras for monitoring the state of fields and crops <Configuration example of layer-type solid-state image-capturing apparatus to which technology according to present disclosure can be applied>

Figure 24A:
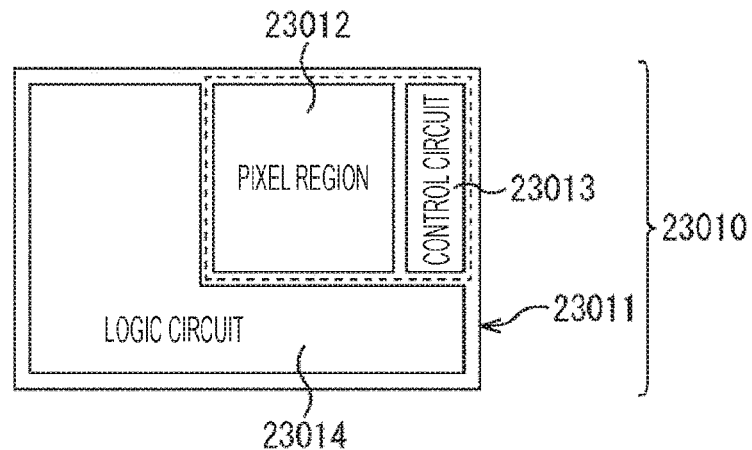
FIGS. 24A, 24B, and 24C are diagrams showing an outline of a configuration example of a layer-type solid-state image-capturing apparatus to which a technology according to the present disclosure can be applied.
Figure 24B:
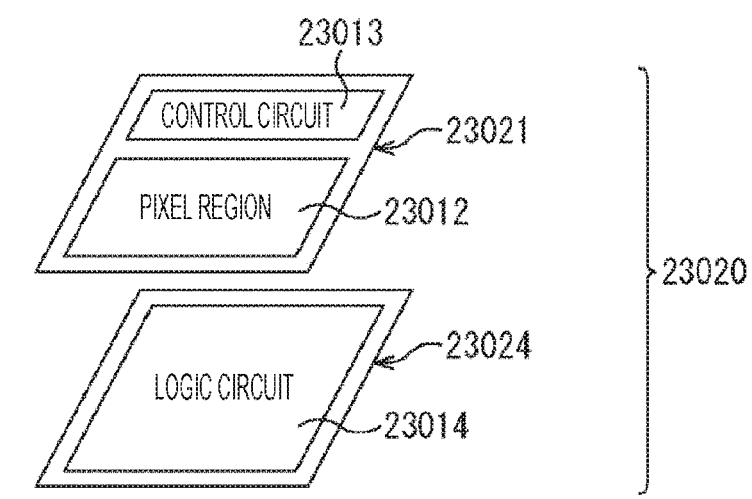
Figure 24C:
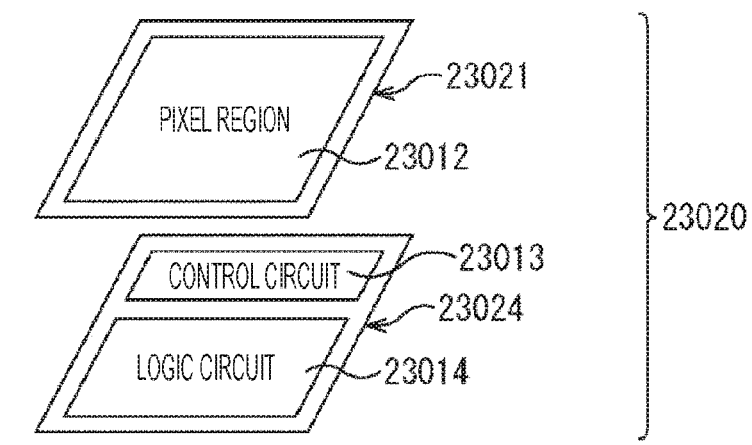

FIGS. 24A, 24B, and 24C are diagrams showing an outline of a configuration example of a layer-type solid-state image-capturing apparatus to which the technology according to the present disclosure can be applied.

FIG. 24A shows a schematic configuration example of a non-layer-type solid-state image-capturing apparatus. A solid-state image-capturing apparatus 23010 has one die (semiconductor substrate) 23011 as shown in FIG. 24A. The die 23011 is mounted with a pixel region 23012 in which pixels are arranged in an array, a control circuit 23013 that drives the pixels and performs various other controls, and a logic circuit 23014 that performs signal processing.

FIGS. 24B and 24C show a schematic configuration example of a layer-type solid-state image-capturing apparatus. As shown in FIGS. 24B and 24C, a solid-state image-capturing apparatus 23020 is configured as one semiconductor chip in which two dies of a sensor die 23021 and a logic die 23024 are layered and electrically connected.

In FIG. 24B, the pixel region 23012 and the control circuit 23013 are mounted on the sensor die 23021, and the logic circuit 23014 including a signal processing circuit that performs signal processing is mounted on the logic die 23024.

In FIG. 24C, the pixel region 23012 is mounted on the sensor die 23021, and the control circuit 23013 and the logic circuit 23014 are mounted on the logic die 23024.

Figure 25:
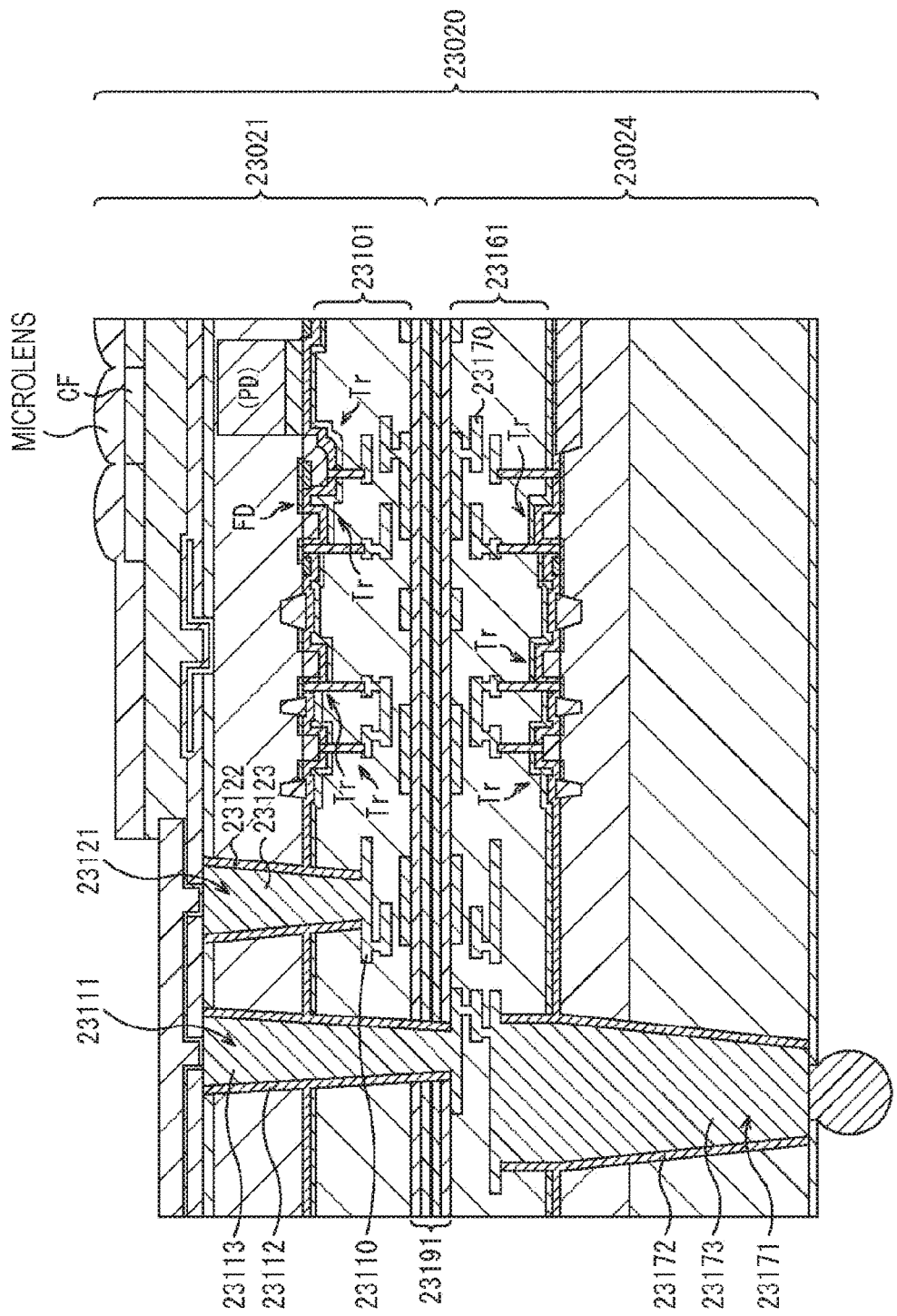
FIG. 25 is a cross sectional view showing a first configuration example of a layer-type solid-state image-capturing apparatus 23020.

FIG. 25 is a cross sectional view showing a first configuration example of the layer-type solid-state image-capturing apparatus 23020.

The sensor die 23021 is formed with a photodiode (PD), a floating diffusion (FD), and a Tr (MOS FET) that constitute pixels to become the pixel region 23012, and a Tr to become the control circuit 23013, for example. Furthermore, the sensor die 23021 is formed with a wiring layer 23101 having a plurality of layers, in this example, three layers of wiring 23110. It is to be noted that (Tr to become) the control circuit 23013 can be configured in the logic die 23024 not the sensor die 23021.

The logic die 23024 is formed with Tr constituting the logic circuit 23014. Furthermore, the logic die 23024 is formed with a wiring layer 23161 having a plurality of layers, in this example, three layers of wiring 23170. In addition, the logic die 23024 is formed with a connection hole 23171 having an insulation film 23172 formed on an inner wall surface, and the connection hole 23171 is embedded with a connection conductor 23173 connected to the wiring 23170 or the like.

The sensor die 23021 and the logic die 23024 are bonded together so that the wiring layers 23101 and 23161 face each other, thereby configuring the layer-type solid-state image-capturing apparatus 23020 in which the sensor die 23021 and the logic die 23024 are layered. A film 23191 such as a protective film is formed on a surface where the sensor die 23021 and the logic die 23024 are bonded together.

The sensor die 23021 is formed with a connection hole 23111 penetrating the sensor die 23021 from the back surface side (side where light enters the PD) (upper side) of the sensor die 23021 and reaching the wiring 23170 of the uppermost layer of the logic die 23024.

Furthermore, the sensor die 23021 is formed with a connection hole 23121 reaching the first wiring 23110 from the back surface side of the sensor die 23021 in proximity to the connection hole 23111. An insulation film 23112 is formed on the inner wall surface of the connection hole 23111, and an insulation film 23122 is formed on the inner wall surface of the connection hole 23121. Then, the connection holes 23111 and 23121 are embedded with connection conductors 23113 and 23123, respectively. The connection conductor 23113 and the connection conductor 23123 are electrically connected on the back surface side of the sensor die 23021, whereby the sensor die 23021 and the logic die 23024 are electrically connected via the wiring layer 23101, the connection hole 23121, the connection hole 23111, and the wiring layer 23161.

Figure 26:
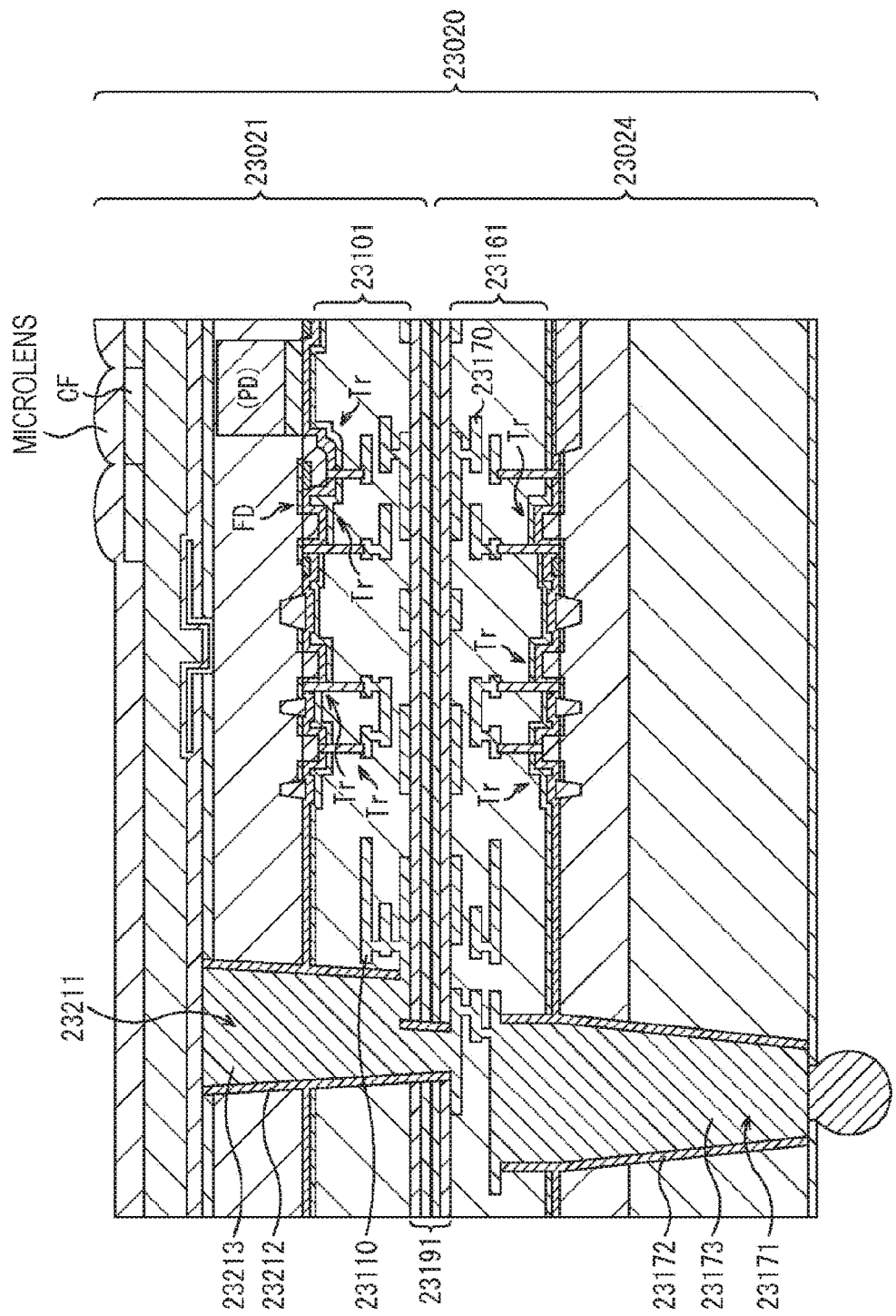
FIG. 26 is a cross sectional view showing a second configuration example of the layer-type solid-state image-capturing apparatus 23020.

FIG. 26 is a cross sectional view showing the second configuration example of the layer-type solid-state image-capturing apparatus 23020.

In the second configuration example of the solid-state image-capturing apparatus 23020, ((the wiring 23110 of) the wiring layer 23101 of) the sensor die 23021 and ((the wiring 23170 of) the wiring layer 23161 of) the logic die 23024 are electrically connected by one connection hole 23211 formed in the sensor die 23021.

That is, in FIG. 26, the connection hole 23211 is formed so as to penetrate the sensor die 23021 from the back surface side of the sensor die 23021 and reach the wiring 23170 of the uppermost layer of the logic die 23024, and to reach the wiring 23110 of the uppermost layer of the sensor die 23021. An insulation film 23212 is formed on the inner wall surface of the connection hole 23211, and a connection conductor 23213 is embedded in the connection hole 23211. In FIG. 25 described above, the sensor die 23021 and the logic die 23024 are electrically connected by the two connection holes 23111 and 23121, whereas in FIG. 26, the sensor die 23021 and the logic die 23024 are electrically connected by the one connection hole 23211.

Figure 27:
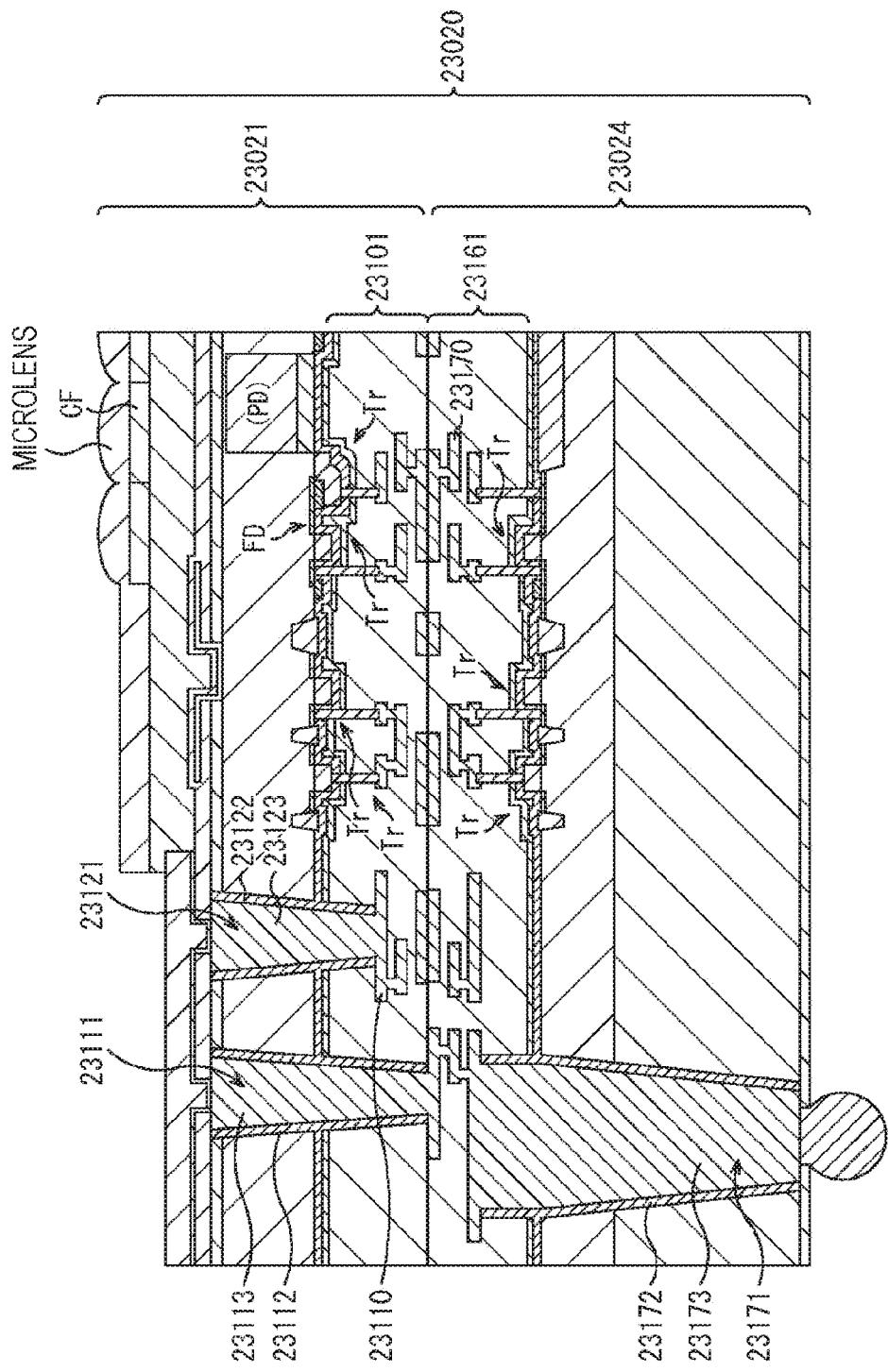
FIG. 27 is a cross sectional view showing a third configuration example of the layer-type solid-state image-capturing apparatus 23020.

FIG. 27 is a cross sectional view showing the third configuration example of the layer-type solid-state image-capturing apparatus 23020.

The solid-state image-capturing apparatus 23020 of FIG. 27 is different from that in the case of FIG. 23 because the former has the film 23191 such as a protective film not formed on the surface where the sensor die 23021 and the logic die 23024 are bonded, and the latter has the film 23191 such as a protective film formed on the surface where the sensor die 23021 and the logic die 23024 are bonded.

The solid-state image-capturing apparatus 23020 of FIG. 27 is configured by superposing the sensor die 23021 and the logic die 23024 so that the wiring 23110 and 23170 come into direct contact with each other, heating them while applying a required load, and directly joining the wiring 23110 and 23170.

Figure 28:
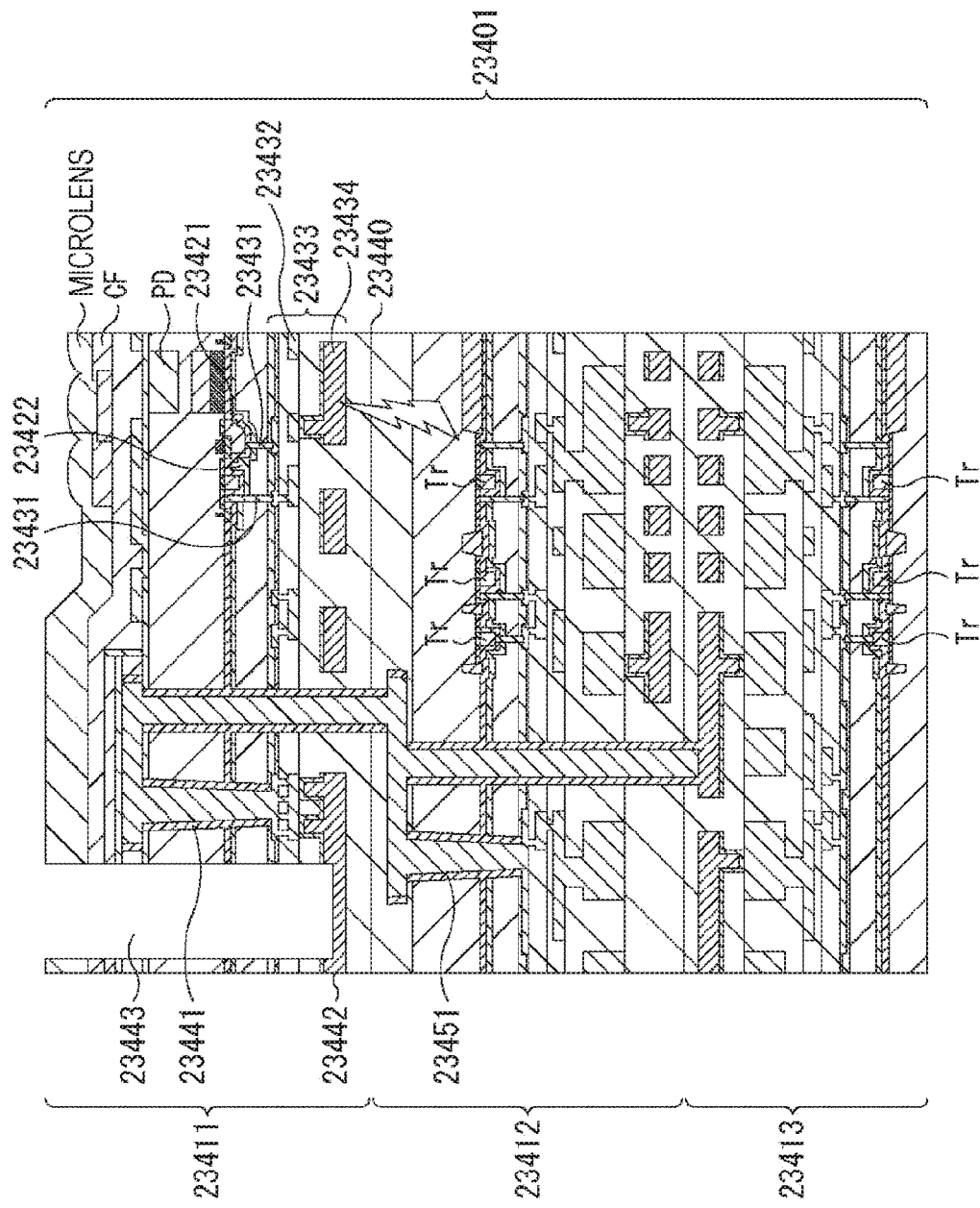
FIG. 28 is a cross sectional view showing another configuration example of a layer-type solid-state image-capturing apparatus to which the technology according to the present disclosure can be applied.

FIG. 28 is a cross sectional view showing another configuration example of the layer-type solid-state image-capturing apparatus to which the technology according to the present disclosure can be applied.

In FIG. 28, a solid-state image-capturing apparatus 23401 has a three-layer structure in which three dies of a sensor die 23411, a logic die 23412, and a memory die 23413 are layered.

The memory die 23413 has a memory circuit that stores data temporarily required in signal processing performed by the logic die 23412, for example.

While in FIG. 28, the logic die 23412 and the memory die 23413 are layered in this order under the sensor die 23411, the logic die 23412 and the memory die 23413 can be layered under the sensor die 23411 in a reverse order, i.e., in order of the memory die 23413 and the logic die 23412.

It is to be noted that in FIG. 28, the sensor die 23411 is formed with a PD to become a photoelectric conversion unit of a pixel and a source/drain region of a pixel Tr.

A gate electrode is formed around the PD via a gate insulation film, and a pixel Tr 23421 and a pixel Tr 23422 are formed by the gate electrode and a pair of source/drain regions.

The pixel Tr 23421 adjacent to the PD is a transfer Tr, and one of the pair of source/drain regions constituting the pixel Tr 23421 is an FD.

In addition, the sensor die 23411 is formed with an interlayer insulation film, and the interlayer insulation film is formed with a connection hole. The connection hole is formed with the pixel Tr 23421 and a connection conductor 23431 connected to the pixel Tr 23422.

Furthermore, the sensor die 23411 is formed with a wiring layer 23433 having a plurality of layers of wiring 23432 connected to each connection conductor 23431.

In addition, the lowermost layer of the wiring layer 23433 of the sensor die 23411 is formed with an aluminum pad 23434 to become an electrode for external connection. That is, in the sensor die 23411, the aluminum pad 23434 is formed at a position closer to an adhesive surface 23440 with the logic die 23412 than the wiring 23432. The aluminum pad 23434 is used as one end of wiring related to input/output of signals from/to the outside.

Furthermore, the sensor die 23411 is formed with a contact 23441 used for electrical connection with the logic die 23412. The contact 23441 is connected to a contact 23451 of the logic die 23412 and also connected to an aluminum pad 23442 of the sensor die 23411.

Then, the sensor die 23411 is formed with a pad hole 23443 so as to reach the aluminum pad 23442 from the back surface side (upper side) of the sensor die 23411.

The technology according to the present disclosure can be applied to the solid-state image-capturing apparatus as described above.

<Combination Example of Configuration>

It is to be noted that the present technology can also have the following configurations.

(1)

A solid-state image-capturing device, including: a plurality of through electrodes electrically connected respectively to a plurality of electrode pads provided on a second main plane side from a first main plane of a semiconductor substrate;

a common opening portion formed including a through electrode formation region that is a region in which the plurality of through electrodes is formed;

a plurality of through portions formed so as to penetrate to the plurality of respective electrode pads in the common opening portion; and wiring formed from the electrode pads to the first main plane corresponding to the respective through electrodes.

(2)

The solid-state image-capturing device according to (1), in which the common opening portion is formed at a depth shallower than a depth from the first main plane to the electrode pad, and the wiring is formed along the common opening portion and the through portion.

(3)

The solid-state image-capturing device according to (1), in which the common opening portion is formed at a depth to the electrode pad from the first main plane, an insulation film is embedded in at least the common opening portion, and the through portion is formed so as to penetrate the insulation film, and the wiring is formed by being layered on the insulation film.

(4)

The solid-state image-capturing device according to (3), in which the insulation film is formed with a recess portion inside the common opening portion so as to include the plurality of through electrodes at a depth shallower than a depth to the electrode pad from the first main plane, and the through portion is formed so as to penetrate to each of the plurality of electrode pads from a bottom surface of the recess portion.

(5)

The solid-state image-capturing device according to (3), in which the insulation film is layered also on a surface of the semiconductor substrate, and a surface of the insulation film is formed so as to be flat between the surface of the semiconductor substrate and the common opening portion, and in the common opening portion, the through portion is formed so as to penetrate to each of the plurality of electrode pads from the surface of the insulation film.

(6)

The solid-state image-capturing device according to any of (3) to (5), in which the insulation film includes an inorganic film or an organic film.

(7)

The solid-state image-capturing device according to any of (1) to (6), in which the plurality of through electrodes is formed so as to penetrate a circuit board on which a logic circuit is formed in a layer structure in which a plurality of semiconductor substrates is layered.

(8)

The solid-state image-capturing device according to any of (1) to (7), in which the plurality of through electrodes is formed so as to penetrate a sensor board on which a pixel is formed in a layer structure in which a plurality of semiconductor substrates is layered.

(9)

The solid-state image-capturing device according to any of (1) to (8), in which cross sectional shapes of side surfaces of the common opening portion and the through portion are formed in a vertical shape.

(10)

The solid-state image-capturing device according to any of (1) to (8), in which a cross sectional shape of a side surface of the common opening portion is formed in a tapered shape, and a cross sectional shape of a side surface of the through portion is formed in a vertical shape.

(11)

The solid-state image-capturing device according to any of (1) to (8), in which a cross sectional shape of a side surface of the common opening portion is formed in a vertical shape, and a cross sectional shape of a side surface of the through portion is formed in a vertical shape at a lower portion and formed in a tapered shape at an upper portion.

(12)

The solid-state image-capturing device according to any of (1) to (8), in which a cross sectional shape of a side surface of the common opening portion is formed in a tapered shape, and a cross sectional shape of a side surface of the through portion is formed in a vertical shape at a lower portion and formed in a tapered shape at an upper portion.

(13)

The solid-state image-capturing device according to any of (1) to (8), in which cross sectional shapes of side surfaces of the common opening portion and the through portion are each formed in a vertical shape at a lower portion and each formed in a tapered shape at an upper portion.

(14)

The solid-state image-capturing device according to any of (1) to (8), in which cross sectional shapes of side surfaces of the common opening portion and the through portion are each formed in a tapered shape.

(15)

The solid-state image-capturing device according to any of (1) to (14), in which the plurality of through electrodes is formed with solder balls used for connection from the wiring to an outside.

(16)

The solid-state image-capturing device according to any of (1) to (14), in which the plurality of through electrodes is formed with plane electrode pads used for connection from the wiring to an outside.

(17)

A semiconductor apparatus, including:

a plurality of through electrodes electrically connected respectively to a plurality of electrode pads provided on a second main plane side from a first main plane of a semiconductor substrate;

a common opening portion formed at a depth shallower than a depth to the electrode pad from the first main plane in a through electrode formation region that is a region in which the plurality of through electrodes is formed;

a plurality of through portions formed so as to penetrate to the plurality of respective electrode pads in the common opening portion; and wiring formed along the common opening portion and the through portion from the electrode pads to the first main plane corresponding to the respective through electrodes.

(18)

An electronic apparatus, including a solid-state image-capturing device, having:

a plurality of through electrodes electrically connected respectively to a plurality of electrode pads provided on a second main plane side from a first main plane of a semiconductor substrate;

a common opening portion formed at a depth shallower than a depth to the electrode pad from the first main plane in a through electrode formation region that is a region in which the plurality of through electrodes is formed;

a plurality of through portions formed so as to penetrate to the plurality of respective electrode pads in the common opening portion; and wiring formed along the common opening portion and the through portion from the electrode pads to the first main plane corresponding to the respective through electrodes.

(19)

A manufacturing method, including:

forming a common opening portion at a depth shallower than a depth from the first main plane to the electrode pad in a through electrode formation region that is a region in which a plurality of through electrodes electrically connected respectively to a plurality of electrode pads provided on a second main plane side from a first main plane of a semiconductor substrate is formed;

forming a plurality of through portions so as to penetrate to the plurality of respective electrode pads in the common opening portion; and forming wiring along the common opening portion and the through portion from the electrode pads to the first main plane corresponding to the respective through electrodes.

It is to be noted that the present embodiments are not limited to the above-described embodiments, and various modifications can be made in a scope without departing from the spirit of the present disclosure. In addition, the effects described in the present description are merely exemplary and not limited thereto, and other effects may be present.

REFERENCE SIGNS LIST

11 Solid-state image-capturing device
12 Circuit board
13 Sensor board
14 Solder mask
21 Electrode pad
22 Through electrode
31 Common opening portion
32 Through portion
33 Through electrode wiring
34 Solder ball
35 Plane electrode pad
41 Insulation film
42 Barrier metal layer
43 Plating seed layer
44 Rewiring layer

The invention claimed is:

1. A solid-state image-capturing device, comprising:
   a plurality of through electrodes electrically connected respectively to a plurality of electrode pads, wherein the plurality of electrode pads is on a second main plane side of a semiconductor substrate from a first main plane side of the semiconductor substrate;
   a common opening portion including a through electrode formation region, wherein the through electrode formation region includes the plurality of through electrodes;
   a plurality of through portions that penetrates to the plurality of respective electrode pads in the common opening portion; and
   a through electrode wiring from the plurality of electrode pads to the first main plane side corresponding to the respective plurality of through electrodes, wherein the through electrode wiring includes an insulation film, a barrier metal layer, a plating seed layer, and a rewiring layer in an order.

2. The solid-state image-capturing device according to claim 1, wherein
   the common opening portion is at a depth shallower than a depth from the first main plane side to the plurality of electrode pads, and
   the through electrode wiring is along the common opening portion and the plurality of through portions.

3. The solid-state image-capturing device according to claim 1, wherein
   the common opening portion is at a depth to the plurality of electrode pads from the first main plane side,
   the insulation film is embedded in at least the common opening portion, and the plurality of through portions penetrates the insulation film, and
   the through electrode wiring is layered on the insulation film.

4. The solid-state image-capturing device according to claim 3, wherein
   the insulation film is with a recess portion inside the common opening portion so as to include the plurality of through electrodes at a depth shallower than a depth to the plurality of electrode pads from the first main plane side, and
   the plurality of through portions penetrates each of the plurality of electrode pads from a bottom surface of the recess portion.

5. The solid-state image-capturing device according to claim 3, wherein
   the insulation film is layered on a surface of the semiconductor substrate, and a surface of the insulation film is flat between the surface of the semiconductor substrate and the common opening portion, and
   in the common opening portion, the plurality of through portions penetrates each of the plurality of electrode pads from the surface of the insulation film.

6. The solid-state image-capturing device according to claim 3, wherein
   the insulation film includes an inorganic film or an organic film.

7. The solid-state image-capturing device according to claim 1, further comprising a circuit board, wherein
   the plurality of through electrodes penetrates the circuit board,
   the circuit board includes a logic circuit, and
   the circuit board is in a layer structure in which a plurality of semiconductor substrates is layered.

8. The solid-state image-capturing device according to claim 1, further comprising a sensor board, wherein
   the plurality of through electrodes penetrates the sensor board,
   the sensor board includes a pixel, and
   the sensor board is in a layer structure in which a plurality of semiconductor substrates is layered.

9. The solid-state image-capturing device according to claim 1, wherein
   a cross sectional shape of each side surface of a plurality of side surfaces of each of the common opening portion and the plurality of through portions is a vertical shape.

10. The solid-state image-capturing device according to claim 1, wherein
    a cross sectional shape of a side surface of the common opening portion is a tapered shape, and
    a cross sectional shape of a side surface of each through portion of the plurality of through portions is a vertical shape.

11. The solid-state image-capturing device according to claim 1, wherein
    a cross sectional shape of a side surface of the common opening portion is a vertical shape, and
    a cross sectional shape of a side surface of each through portion of the plurality of through portions is a vertical shape at a lower portion and a tapered shape at an upper portion.

12. The solid-state image-capturing device according to claim 1, wherein
    a cross sectional shape of a side surface of the common opening portion is a tapered shape, and
    a cross sectional shape of a side surface of each though portion of the plurality of through portions is a vertical shape at a lower portion and a tapered shape at an upper portion.

13. The solid-state image-capturing device according to claim 1, wherein
    a cross sectional shape of each side surface of a plurality of side surfaces of each of the common opening portion and the plurality of through portions is a vertical shape at a lower portion and a tapered shape at an upper portion.

14. The solid-state image-capturing device according to claim 1, wherein
    a cross sectional shape of each side surface of a plurality of side surfaces of each of the common opening portion and the plurality of through portions is a tapered shape.

15. The solid-state image-capturing device according to claim 1, wherein
    the plurality of through electrodes includes a plurality of solder balls, and
    the plurality of solder balls is utilized for connection from the through electrode wiring to an outside of the semiconductor substrate.

16. The solid-state image-capturing device according to claim 1, wherein
    the plurality of through electrodes includes a plurality of plane electrode pads, and
    the plurality of plane electrode pads is utilized for connection from the through electrode wiring to an outside of the semiconductor substrate.

17. A semiconductor apparatus, comprising:
    a plurality of through electrodes electrically connected respectively to a plurality of electrode pads, wherein the plurality of electrode pads is on a second main plane side of a semiconductor substrate from a first main plane side of the semiconductor substrate;

a common opening portion including a through electrode formation region, wherein the through electrode formation region includes the plurality of through electrodes;

a plurality of through portions that penetrates to the plurality of respective electrode pads in the common opening portion; and a through electrode wiring from the plurality of electrode pads to the first main plane side corresponding to the respective plurality of through electrodes, wherein the through electrode wiring includes an insulation film, a barrier metal layer, a plating seed layer, and a rewiring layer in an order.

18. An electronic apparatus, comprising:

a solid-state image-capturing device that includes:

a plurality of through electrodes electrically connected respectively to a plurality of electrode pads, wherein the plurality of electrode pads is on a second main plane side of a semiconductor substrate from a first main plane side of the semiconductor substrate;

a common opening portion including a through electrode formation region, wherein the through electrode formation region includes the plurality of through electrodes;

a plurality of through portions that penetrates to the plurality of respective electrode pads in the common opening portion; and a through electrode wiring from the electrode pads to the first main plane side corresponding to the respective plurality of through electrodes, wherein the through electrode wiring includes an insulation film, a barrier metal layer, a plating seed layer, and a rewiring layer in an order.

19. A manufacturing method, comprising:

forming a common opening portion including a through electrode formation region, wherein a plurality of through electrodes electrically connected respectively to a plurality of electrode pads provided on a second main plane side from a first main plane side of a semiconductor substrate formed in the through electrode formation region;

forming a plurality of through portions so as to penetrate to the plurality of respective electrode pads in the common opening portion; and forming a through electrode wiring from the electrode pads to the first main plane side corresponding to the respective plurality of through electrodes, wherein the through electrode wiring includes an insulation film, a barrier metal layer, a plating seed layer, and a rewiring layer in an order.

* * * * *